(12) United States Patent
Wang et al.

(10) Patent No.: US 11,282,943 B2
(45) Date of Patent: Mar. 22, 2022

(54) MULTI-GATE DEVICES AND FABRICATING THE SAME WITH ETCH RATE MODULATION

(71) Applicant: Taiwan Semiconductor Manufacturing Co., Ltd., Hsin-Chu (TW)

(72) Inventors: Chih-Ching Wang, Kinmen County (TW); Chung-I Yang, Hsinchu (TW); Jon-Hsu Ho, New Taipei (TW); Wen-Hsing Hsieh, Hsinchu (TW); Kuan-Lun Cheng, Hsin-Chu (TW); Chung-Wei Wu, Hsin-Chu County (TW); Zhiqiang Wu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 80 days.

(21) Appl. No.: 16/901,881

(22) Filed: Jun. 15, 2020

(65) Prior Publication Data
US 2021/0391443 A1    Dec. 16, 2021

(51) Int. Cl.
*H01L 29/66* (2006.01)
*H01L 21/8234* (2006.01)
*H01L 29/417* (2006.01)
*H01L 29/78* (2006.01)

(52) U.S. Cl.
CPC .. *H01L 29/6681* (2013.01); *H01L 21/823431* (2013.01); *H01L 29/41791* (2013.01); *H01L 29/785* (2013.01); *H01L 2029/7858* (2013.01)

(58) Field of Classification Search
CPC .......... H01L 29/6681; H01L 29/41791; H01L 29/785; H01L 21/823431
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |

(Continued)

*Primary Examiner* — Christine A Enad
(74) *Attorney, Agent, or Firm* — Haynes and Boone, LLP

(57) ABSTRACT

The present disclosure provides a method of manufacturing a semiconductor device. The method includes forming a fin structure having first semiconductor layers and second semiconductor layers alternately stacked, forming a sacrificial gate structure over the fin structure, and etching a source/drain (S/D) region thereby forming an opening exposing at least one second semiconductor layer. The method also includes implanting an etch rate modifying species into the at least one second semiconductor layer though the opening thereby forming an implanted portion of the at least one second semiconductor layer. The method further includes selectively etching the implanted portion of the at least one second semiconductor layer, recessing end portions of the first semiconductor layers exposed in the opening, and forming an S/D epitaxial layer in the opening.

16 Claims, 33 Drawing Sheets

(56) References Cited

U.S. PATENT DOCUMENTS

| | | | |
|---|---|---|---|
| 9,576,814 B2 | 2/2017 | Wu et al. | |
| 9,972,701 B2 * | 5/2018 | Kim | H01L 29/78696 |
| 10,535,733 B2 * | 1/2020 | Cheng | B82Y 10/00 |
| 10,930,498 B2 * | 2/2021 | Wang | B82Y 10/00 |
| 11,164,960 B1 * | 11/2021 | Zhang | H01L 29/78696 |
| 2021/0288141 A1 * | 9/2021 | Reznicek | H01L 29/0665 |
| 2021/0336038 A1 * | 10/2021 | Zhang | H01L 29/785 |

* cited by examiner

MULTI-GATE DEVICES AND FABRICATING THE SAME WITH ETCH RATE MODULATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the gate-all-around field effect transistor (GAA FET). The GAA FET device gets its name from the gate structure which can extend around the channel region providing access to the channel on two or four sides. GAA FET devices are compatible with conventional complementary metal-oxide-semiconductor (CMOS) processes and their structure allows them to be aggressively scaled while maintaining gate control and mitigating SCEs. GAA FET devices provide a channel in a stacked nanosheet configuration. Integration of GAA features around stacked nanosheets can be challenging. For example, in a stacked nanosheet GAA process flow, an etching process to form source/drain (S/D) trenches may form extruding end portions of channel layers. These extruding end portions of the channel layers introduce variation in channel lengths, which in turn causes non-uniformity to a GAA FET device. Further, extruding end portions of the channel layers may increase channel resistance, which in turn degrades integrated chip performance. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
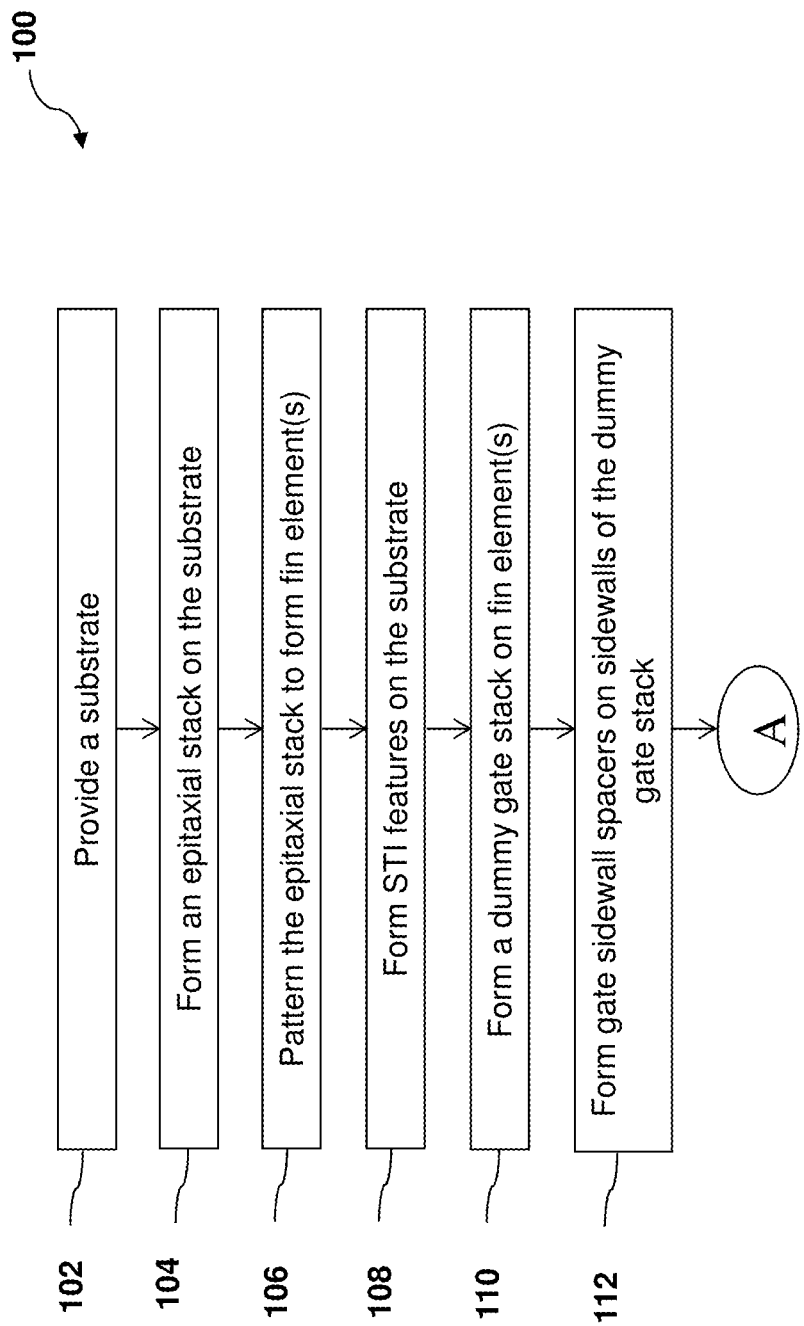
FIGS. 1A and 1B show a flow chart of a method for forming a multi-gate device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating gate-all-around field effect transistor (GAA FET) devices with an etch rate modulation and a selective etching process to trim extruding end portions (lateral ends) of channel layers. In a GAA fabrication flow, after source/drain (S/D) trench formation and/or inner spacer formation, end portions of the channel layers may extrude into S/D trenches with respect to inner spacers and/or gate sidewall spacers. The extruding end portions of the channel layers introduce non-uniformity to a GAA FET device and represent a high resistance path inserted between effective channel regions and S/D epitaxial features. A stronger and/or longer etching to trim extruding end portions of the channel layers has been found ineffective as it also extends S/D trenches deeper into the underneath semiconductor substrate, which may cause pun-through leakage. In various embodiments of the present disclosure, an etch rate modulation is applied to adjust etch rate(s) of one or more channel layers of a GAA FET device by implanting etch rate modifying species into end portions of the respective channel layers. The etch rate modulation together with a selective etching process shrinks the extruding end portions of channel layers and improves channel length uniformity in a GAA FET device.

A GAA FET device is a type of multi-gate device. Multi-gate devices include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FINFET, on account of their fin-like structure. As a type of multi-gate device, a GAA FET device includes any FET device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

Figure 1B:
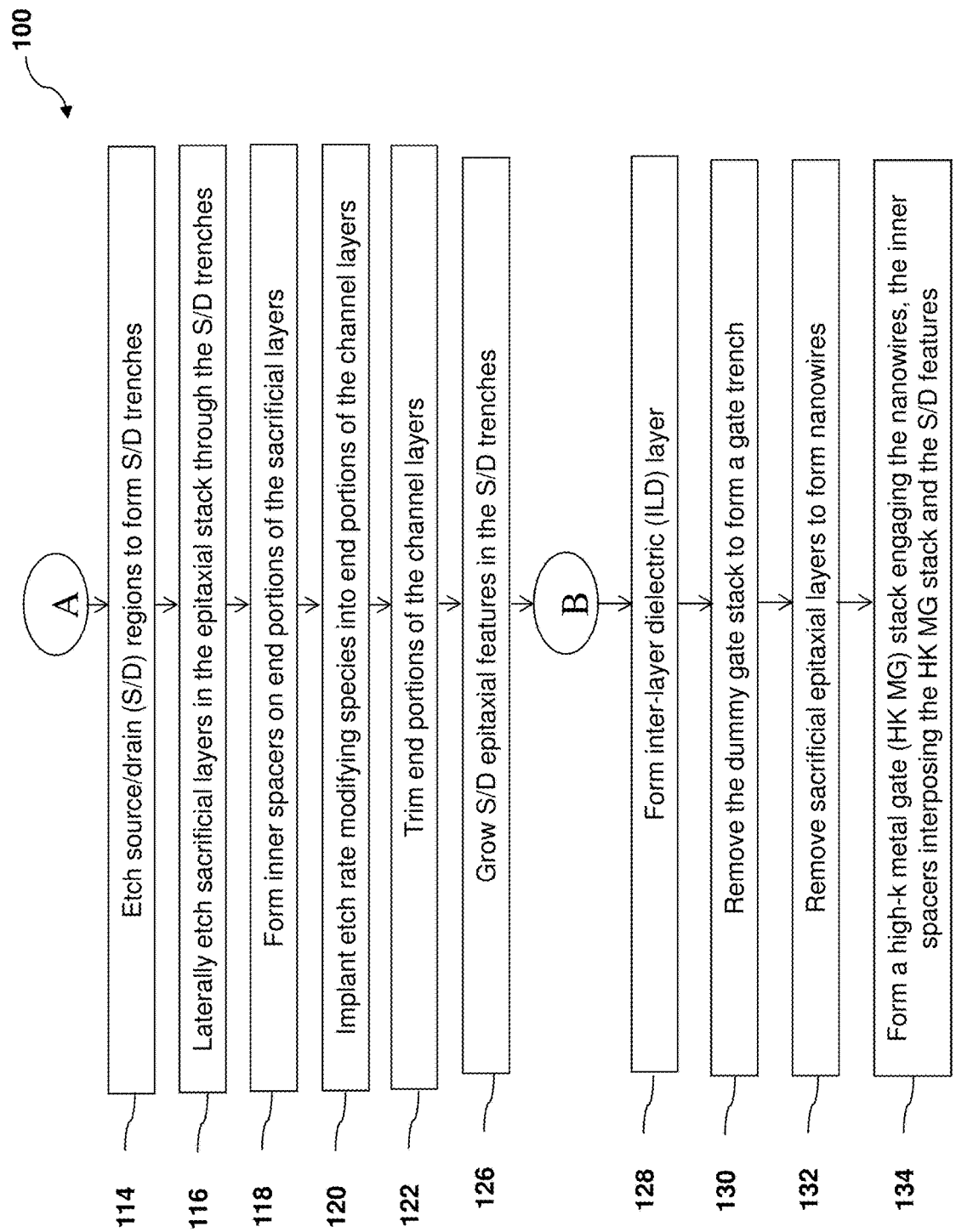

Illustrated in FIGS. 1A and 1B is a method 100 of semiconductor fabrication including fabrication of multi-gate devices. It is understood that additional operations can be provided before, during, and after processes shown by FIGS. 1A and 1B, and some of the operations described below can be replaced or eliminated, for additional embodiments of the method. The order of the operations/processes may be interchangeable. As used herein, the term "multi-gate device" is used to describe a device (e.g., a semiconductor transistor) that has at least some gate material disposed on multiple sides of at least one channel of the device. In some examples, the multi-gate device may be referred to as a GAA FET device or a nanosheet device having gate material disposed on at least four sides of at least one channel of the device. The channel region may also be referred to as a "channel member," which as used herein includes channel regions of various geometries (e.g., cylindrical, bar-shaped) and various dimensions.

The method 100 is described below with references to FIGS. 1A and 1B, in conjunction with FIGS. 2-19. FIGS. 2, 3, 4, 5, 6, 7, 8, 9, 10A, 16, 17, 18, and 19 are perspective views of an embodiment of a GAA FET device 10 (or device 10) according to various stages of the method 100 of FIGS. 1A and 1B. FIGS. 10B, 11, 12, 13, 14, and 15 are corresponding cross-sectional views of an embodiment of the device 10 along a cut (e.g., cut X1-X1 in FIG. 10A), which is along a lengthwise direction of the channel and perpendicular to a top surface of the substrate.

Figure 2:
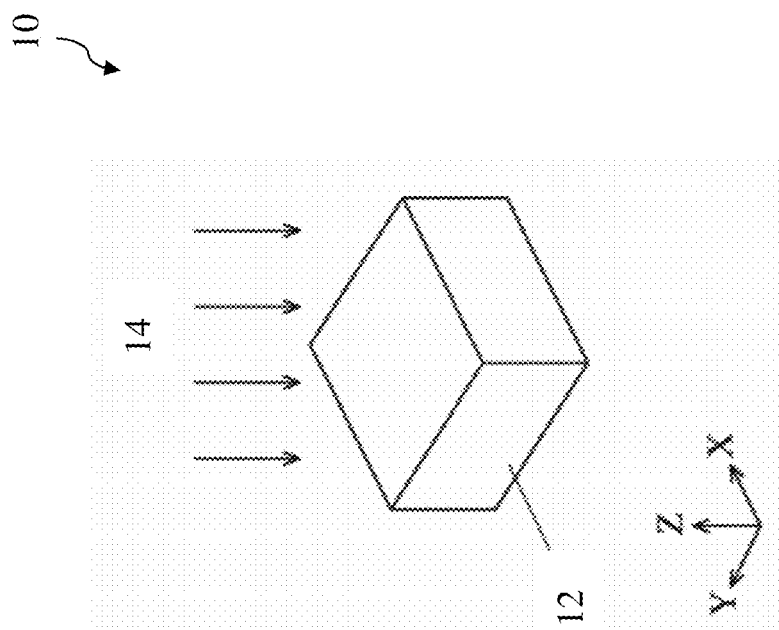
FIGS. 2, 3, 4, 5, 6, 7, 8, 9, 10A, 16, 17, 18, and 19 illustrate perspective views of a semiconductor structure during a fabrication process according to the method of FIGS. 1A and 1B, according to aspects of the present disclosure.

Referring to FIGS. 1A and 2, the method 100 begins at operation 102 where a device 10 with a substrate 12 is provided. The substrate 12 may include various regions that have been suitably doped with impurities (e.g., p-type or n-type conductivity). In some embodiments, the substrate 12 includes a single crystalline semiconductor layer on at least its surface portion. The substrate 12 may comprise a single crystalline semiconductor material such as, but not limited to Si, Ge, SiGe, GaAs, InSb, GaP, GaSb, InAlAs, InGaAs, GaSbP, GaAsSb and InP. In the illustrated embodiment, the substrate 12 is made of Si.

The substrate 12 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 12 comprises silicon germanium (SiGe) buffer layers epitaxially grown on bulk silicon. The germanium concentration of the SiGe buffer layers may increase from 30 atomic % germanium for the bottom-most buffer layer to 70 atomic % germanium for the top-most buffer layer.

In some embodiments, impurity ions (dopants) 14 are implanted into a silicon substrate to form a well region. The ion implantation is performed to prevent a punch-through effect. The dopants 14 are, for example boron (B) for an n-type FinFET or phosphorus (P) for a p-type FinFET.

Figure 3:
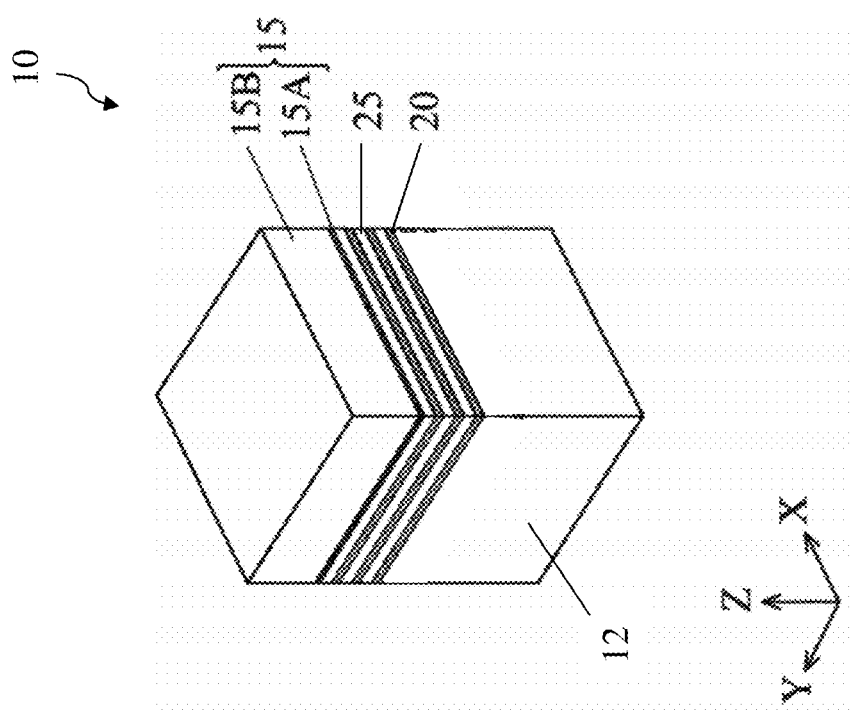

Referring to FIGS. 1A and 3, the method 100 then proceeds to operation 104 where stacked semiconductor layers are formed over the substrate 12. The stacked semiconductor layers include first semiconductor layers 20 and second semiconductor layers 25. Further, a mask layer 15 is formed over the stacked layers. By way of example, the stacked semiconductor layers may be epitaxially grown by a molecular beam epitaxy (MBE) process, a metalorganic chemical vapor deposition (MOCVD) process, and/or other suitable epitaxial growth processes.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. However, other embodiments are possible including those that provide for a first composition and a second composition having different oxidation rates and/or etch selectivity. In at least some examples, the first semiconductor layers 20 include an epitaxially grown SiGe layer and the second semiconductor layers 25 include an epitaxially grown Si layer. The Si oxidation rate of the second semiconductor layers 25 is less than the SiGe oxidation rate of the first semiconductor layers 20. In one example, the first semiconductor layers 20 are $Si_{1-x}Ge_x$, where x is less than about 0.3, such as in a range from about 0.15 to about 0.25. In some embodiments, the first semiconductor layers 20 and the second semiconductor layers 25 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

The second semiconductor layers 25 or portions thereof may form channel members (e.g., nanosheet channels) of the GAA FET device. The term channel member is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the second semiconductor layers 25 to define a channel member or channel members of a device is further discussed below. Accordingly, the second semiconductor layers 25 are also referred to as the channel layers 25, while the first semiconductor layers 20 are also referred to as the sacrificial layers 20.

In FIG. 3, three layers of the first semiconductor layer 20 and three layers of the second semiconductor layer 25 are disposed. However, the number of the layers are not limited to three, and may be as small as one (each layer) and in some embodiments, 2-10 layers of each of the first and second semiconductor layers 20 and 25 are formed. By adjusting the numbers of the stacked layers, a driving current of a GAA FET device can be adjusted.

The first semiconductor layers 20 and the second semiconductor layers 25 are epitaxially formed over the substrate 12. The thickness of the first semiconductor layers 20 may be equal to or greater than that of the second semiconductor layers 25, such as in a range from about 3 nm to about 50 nm in some embodiments, or in a range from about 5 nm to about 15 nm in other embodiments. The thickness of the second semiconductor layers 25 is in a range from about 3 nm to about 30 nm in some embodiments, or in a range from about 5 nm to about 15 nm in other embodiments. The thickness of each of the first semiconductor layers 20 may be the same or may vary. In some embodiments, the bottommost semiconductor layer 20 (the closest layer to the substrate 10) is thicker than the upper semiconductor layers. The thickness of the bottommost semiconductor layer is in a range from about 10 nm to about 50 nm in some embodiments, or in a range from 20 nm to 40 nm in other embodiments.

In some embodiments, the mask layer 15 includes a first mask layer 15A and a second mask layer 15B. The first mask layer 15A is a pad oxide layer made of silicon oxide, which can be formed by a thermal oxidation process. The second mask layer 15B is made of silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 4:
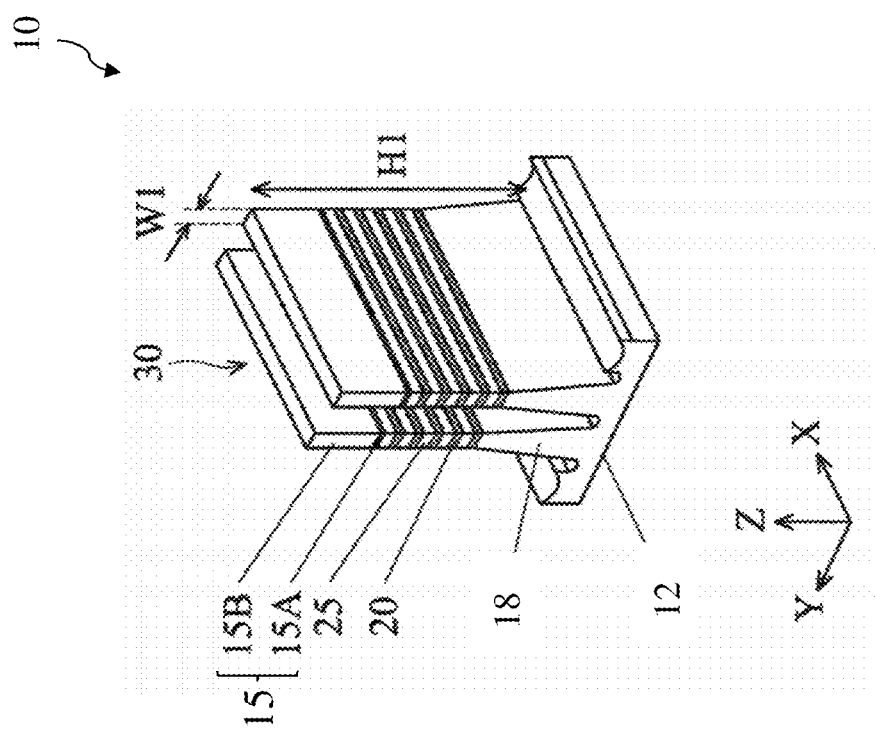

Referring to FIGS. 1A and 4, the method 100 then proceeds to operation 106 where fin elements (also referred to as fins) 30 are formed by patterning the stacked semiconductor layers 20 and 25 by using the patterned mask layer 15. With reference to the example of FIG. 4, in an embodiment of operation 106, a plurality of fins 30 extending from the substrate 12 are formed extending in the X direction. In various embodiments, each of the fins 30 includes upper portions constituted by the stacked semiconductor layers 20 and 25, and well portions 18 formed from the substrate 12. The width W1 of the upper portion of the fin structure along the Y direction is in a range from about 10 nm to about 40 nm in some embodiments, or in a range from about 20 nm to about 30 nm in other embodiments. The height H1 along the Z direction of the fin structure is in a range from about 100 nm to about 200 nm in some embodiments.

The fins 30 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 30 by etching initial stacked semiconductor layers 20 and 25. The etching process can include dry etching, wet etching, reactive ion etching (RIE), and/or other suitable processes.

In FIG. 4, two fins 30 are arranged in the Y direction. But the number of the fins 30 is not limited to and may be as small as one or three or more. In some embodiments, one or more dummy fin structures are formed on both sides of the fins 30 to improve pattern fidelity in the patterning operations.

Figure 5:
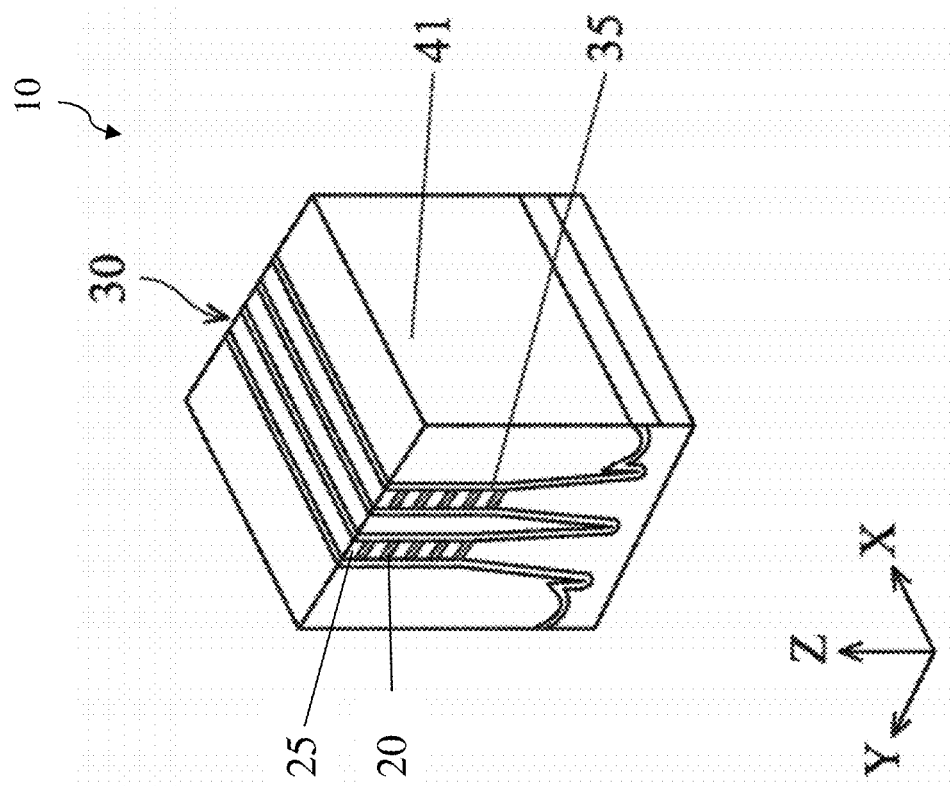
Figure 6:
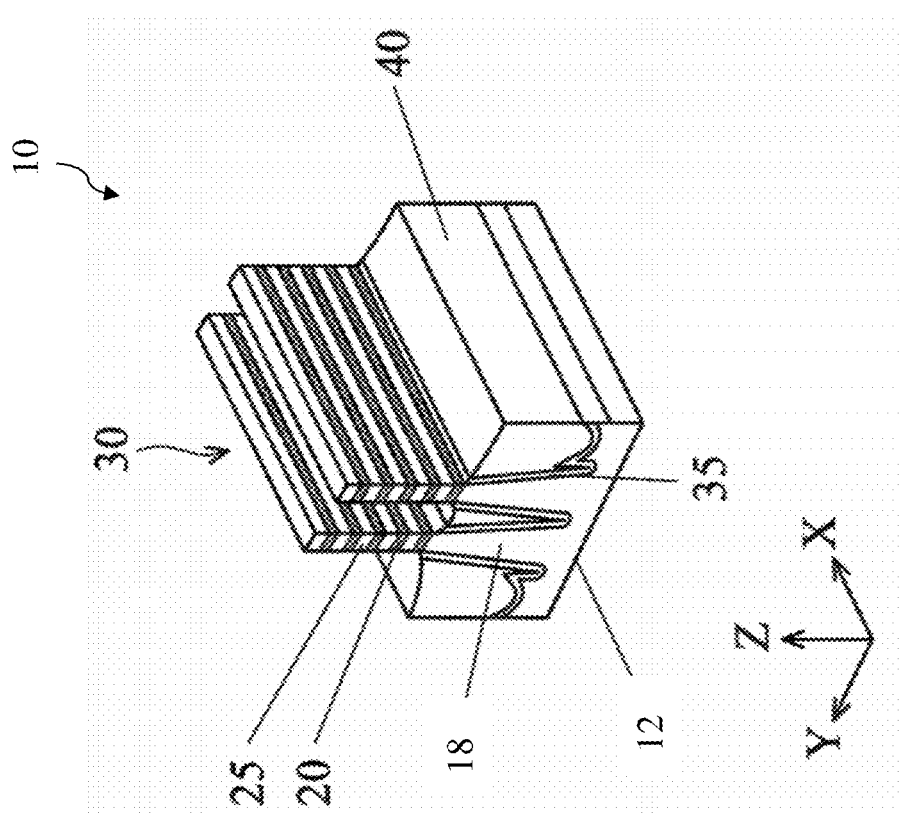

Referring to FIGS. 1A and 5-6, method 100 proceeds to operation 108 by forming a shallow trench isolation (STI) feature interposing the fins 30. By way of example, an insulating material layer 41 including one or more layers of insulating material is formed over the substrate so that the fins 30 are fully embedded in the insulating material layer 41. The insulating material for the insulating material layer 41 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer 41. Then, a planarization operation, such as a chemical mechanical polishing (CMP) method and/or an etch-back method, is performed such that the upper surface of the topmost second semiconductor layer 25 is exposed from the insulating material layer 41 as shown in FIG. 5.

In some embodiments, a liner layer 35 is formed over the device 10 before forming the insulating material layer 41, as shown FIG. 5. In some embodiments, the liner layer 35 is made of SiN or a silicon nitride-based material (e.g., SiON, SiCN or SiOCN). Then, as shown in FIG. 6, the insulating material layer 41 is recessed to form an isolation feature 40 so that the upper portions of the fins 30 are exposed. With this operation, the fins 30 are electrically separated from each other by the isolation feature 40, which is also referred to as a shallow trench isolation (STI) 40.

Figure 7:
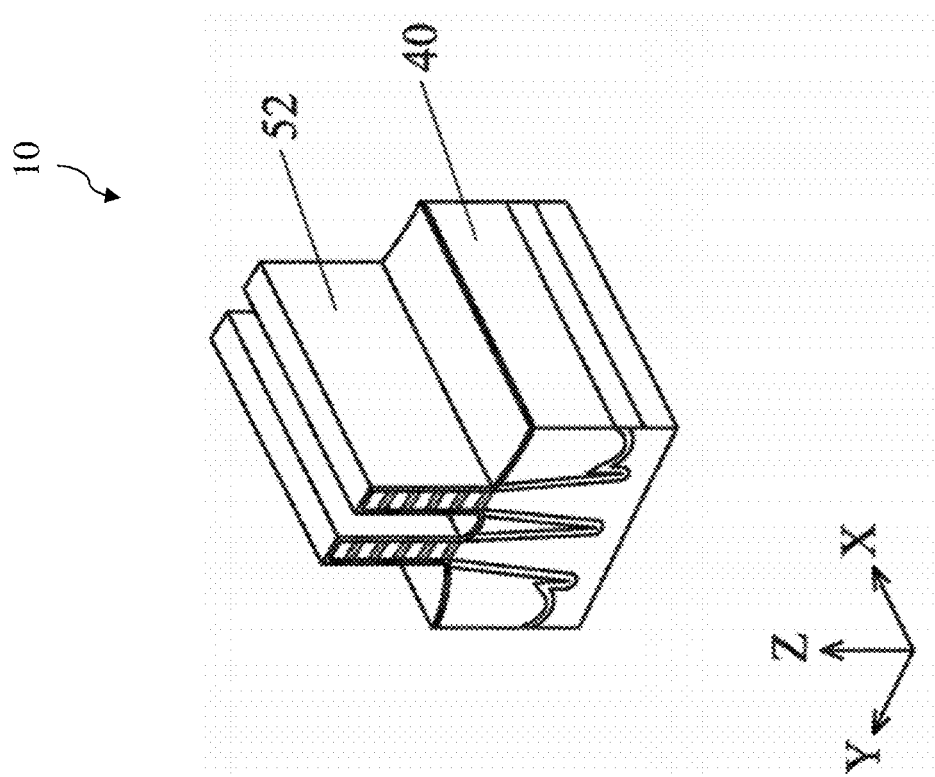
Figure 8:
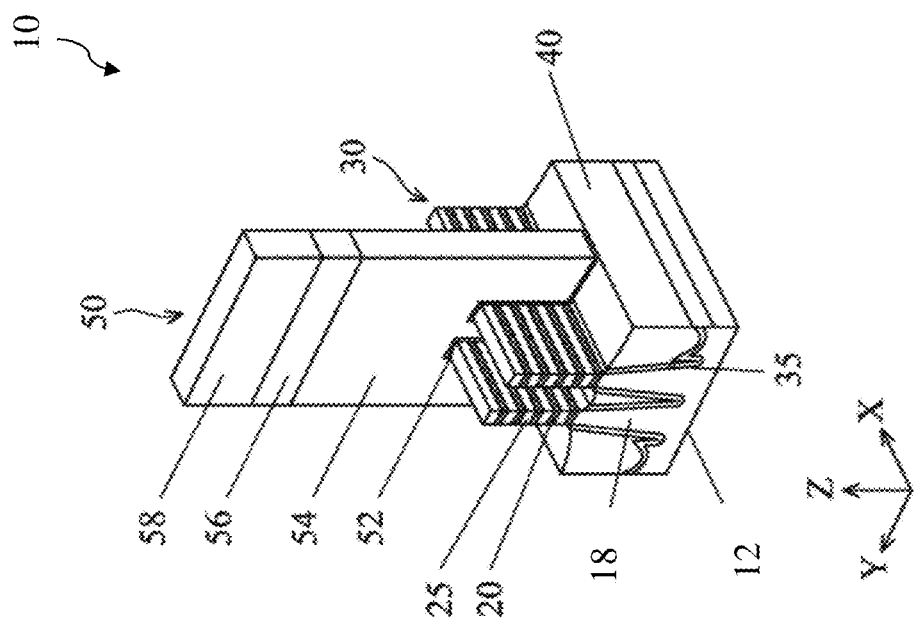

Referring to FIGS. 1A and 7-8, method 100 proceeds to operation 110 where sacrificial layers/features are formed and in particular, a dummy gate structure. While the present discussion is directed to a replacement gate process whereby a dummy gate structure is formed and subsequently replaced, other configurations may be possible. With reference to FIG. 7, after the STI 40 is formed, a sacrificial gate dielectric layer 52 is formed. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

FIG. 8 illustrates a structure after a sacrificial gate structure 50 is formed over the exposed fins 30. The sacrificial gate structure 50 includes the sacrificial gate dielectric layer 52 and a sacrificial gate electrode 54. The sacrificial gate structure 50 is formed over a portion of the fins 30 which is to be a channel region. The sacrificial gate structure defines the channel region of the device 10.

The sacrificial gate structure 50 is formed by first blanket depositing the sacrificial gate dielectric layer 52 over the fins 30. A sacrificial gate electrode layer is then blanket deposited on the sacrificial gate dielectric layer 52 and over the fins 30, such that the fins 30 are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 8. The sacrificial gate structure includes the sacrificial gate dielectric layer 52, the sacrificial gate electrode 54 (e.g., poly silicon), the pad SiN layer 56 and the silicon oxide mask layer 58. By patterning the sacrificial gate structure, the stacked semiconductor layers 20 and 25 are partially exposed on opposite sides of the sacrificial gate structure 50, thereby defining source/drain (S/D) regions. In this disclosure, a source and a drain are interchangeably used and the structures thereof are substantially the same. In FIG. 8, one sacrificial gate structure 50 is formed, but the number of the sacrificial gate structures 50 is not limited to one, two, or more sacrificial gate structures, which are arranged in the X direction in some embodiments. In certain embodiments, one or more dummy sacrificial gate structures are formed on both sides of the sacrificial gate structures to improve pattern fidelity.

Figure 9:
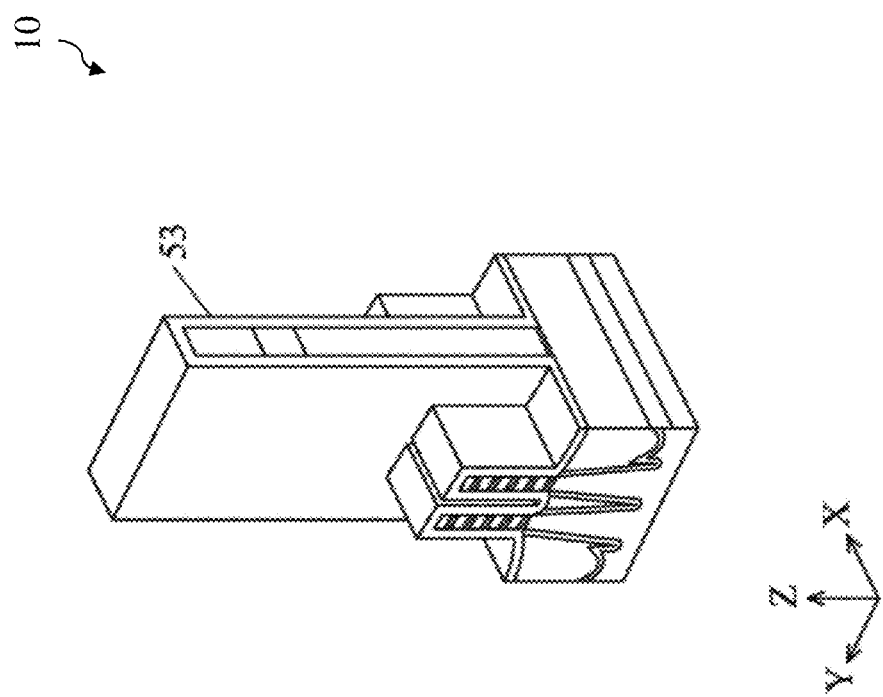

Referring to FIGS. 1A and 9, method 100 then proceeds to operation 112 where gate sidewall spacers are formed. After the sacrificial gate structure 50 is formed, a blanket layer 53 of an insulating material for forming gate sidewall spacers 55 (FIG. 10A) is conformally deposited by using CVD or other suitable methods. The blanket layer 53 is deposited in a conformal manner so that it is formed to have substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 8 nm. In one embodiment, the insulating material of the blanket layer 53 is a silicon nitride-based material, such as SiN, SiON, SiOCN or SiCN and combinations thereof. In some embodiments, the blanket layer may include one or more dielectric material layers, such as a seal layer, a first spacer layer, and a second spacer layer.

After the blanket layer 53 is formed, anisotropic etching is performed on the blanket layer 53 using, for example, reactive ion etching (RIE). During the anisotropic etching process, most of the insulating material is removed from horizontal surfaces, leaving the gate sidewall spacers 55 on the vertical surfaces such as the sidewalls of the sacrificial gate structure 50 and the sidewalls of the exposed fins 30, as shown in FIG. 10A. The mask layer 58 may be exposed from the gate sidewall spacers 55. In some embodiments, isotropic etching may be subsequently performed to remove the insulating material from the upper portions of the S/D region of the exposed fins 30.

Figure 10B:
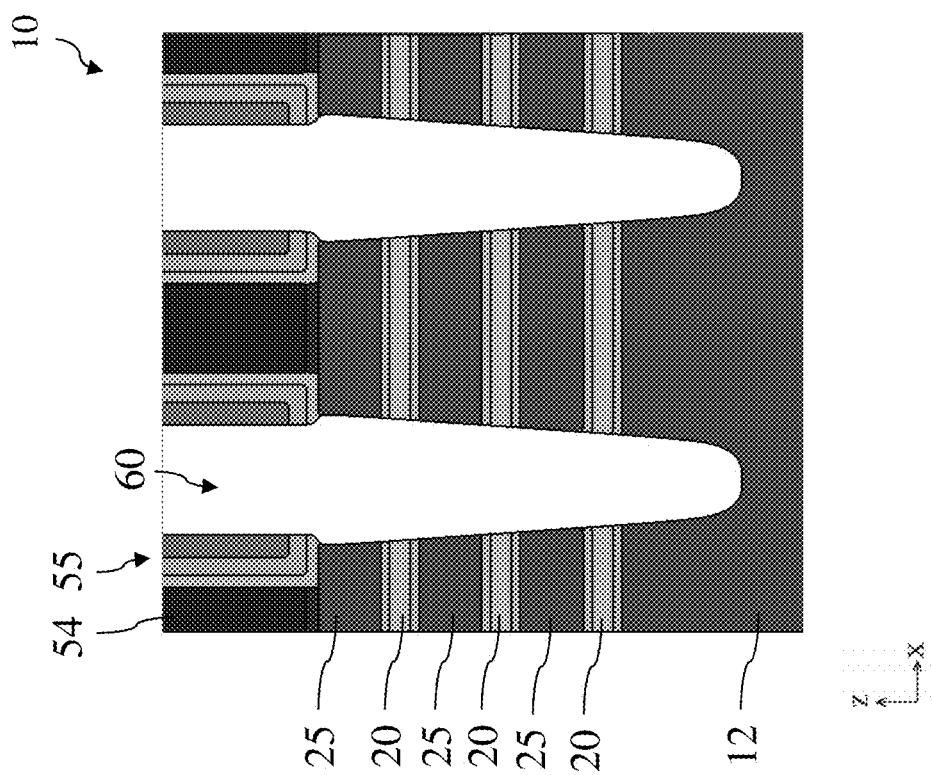
FIGS. 10B, 11, 12, 13, 14, and 15 illustrate cross-sectional views of a semiconductor structure during a fabrication process according to the method of FIGS. 1A and 1B, according to aspects of the present disclosure.
Figure 10A:
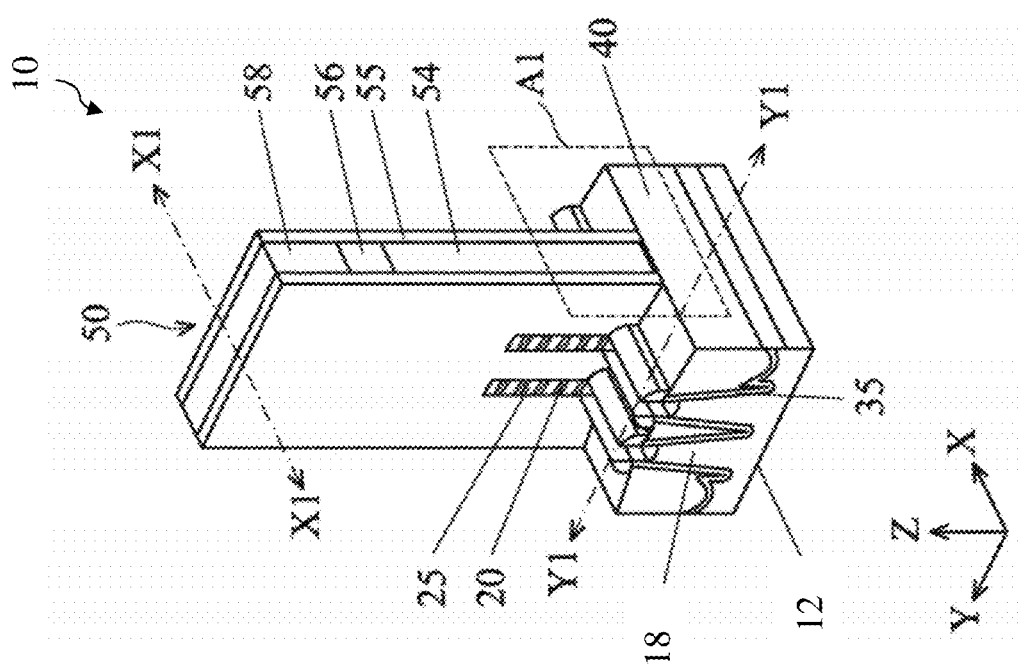

Still referring to FIG. 10A, in conjunction with FIG. 10B, which is the cross sectional view corresponding to area A1 and line X1-X1 of FIG. 10A, method 100 proceeds to operation 114 where the stacked structure of the first semiconductor layers 20 and the second semiconductor layers 25 is etched down at the S/D regions, by using one or more lithography and etching operations, thereby forming S/D trenches 60. In some embodiments, fins 30 in S/D regions are recessed down below the upper surface of the STI 40 by using dry etching and/or wet etching. In the illustrated embodiment, the substrate 12 (or the bottom part 18 of the fin structure) is also partially etched. At this stage, end portions (also referred to as lateral ends) of the stacked semiconductor layers 20 and 25 are exposed in the S/D trenches 60. Due to the loading effects during etching operations, an S/D trench 60 generally has a wider opening on the top than at the bottom. In other words, sidewalls of an S/D trench 60, which comprise end portions of the stacked semiconductor layers 20 and 25, have a slope, resulting in bottom layers of the stacked semiconductor layers 20 and 25 extruding more from edges of the gate sidewall spacers 55 than top layers.

Figure 11:
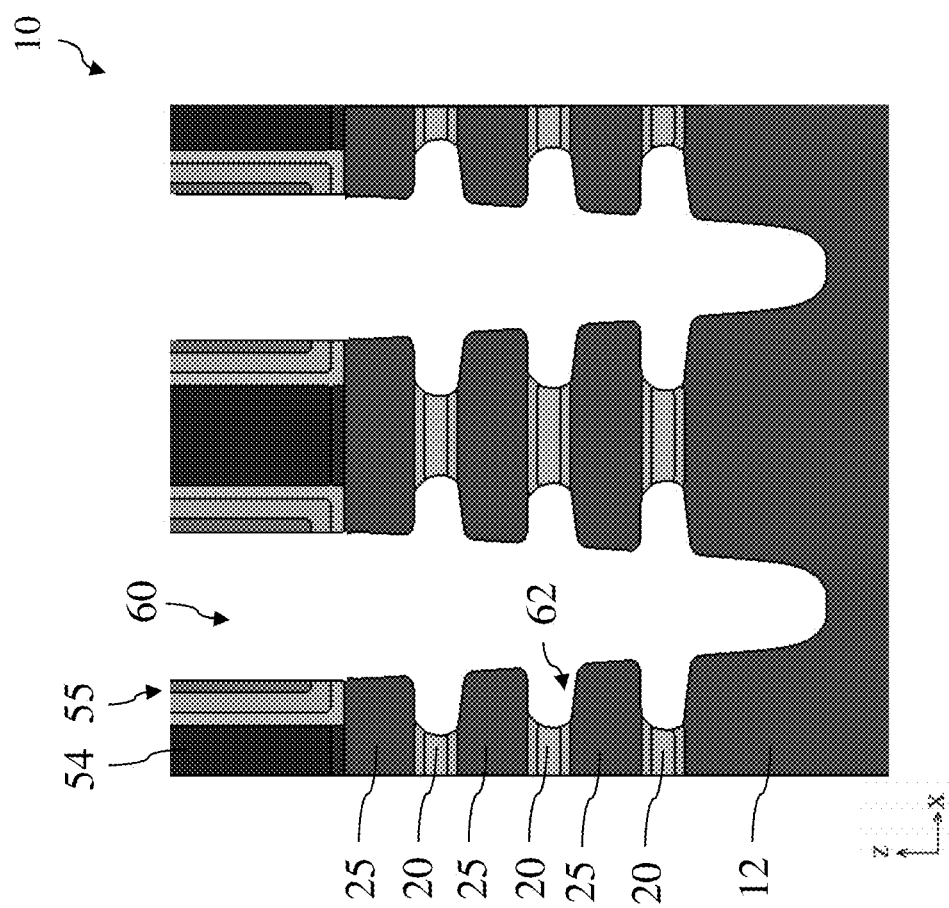

Referring to FIGS. 1A and 11, method 100 proceeds to operation 116 where the first semiconductor layers 20 are laterally etched in the X direction within the S/D trench 60, thereby forming cavities 62. The depth of the cavities 62 along the X direction is in a range from about 3 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

Figure 12:
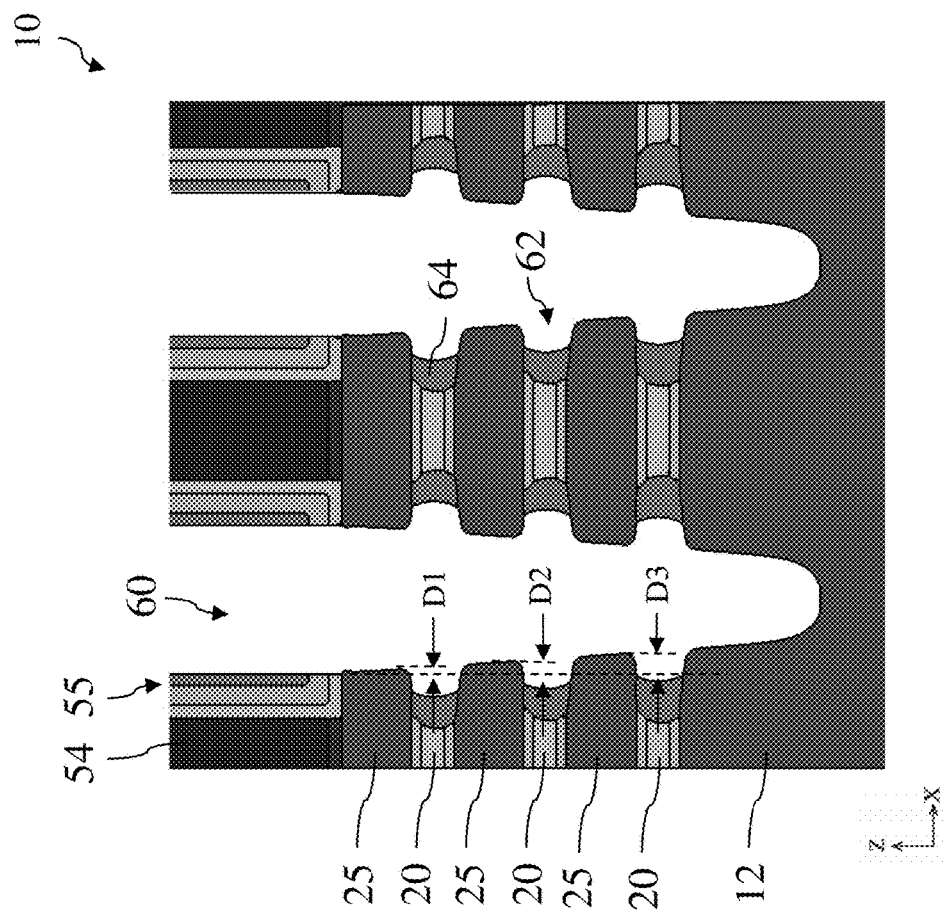

Referring to FIGS. 1A and 12, method 100 proceeds to operation 118 where inner spacers 64 is formed on the end portions of the first semiconductor layers 20. By forming the inner spacers 64, the size of cavities 62 is reduced. In some embodiments, the inner spacers 64 includes a dielectric material, such as SiN, SiOC, SiOCN, SiCN, $SiO_2$, and/or other suitable material, such as a low-k dielectric material with a dielectric constant less than about 3.9. In some embodiments, the inner spacers 64 are formed by first depositing a dielectric material layer in the S/D trench 60, such as a conformal layer covering sidewalls of the S/D trench 60 and filling the cavities 62 by an ALD process or other suitable process. Subsequently, the dielectric material layer is partially removed from sidewalls of the S/D trench 60 to expose end portions of the second semiconductor layers 25 in an etching process. By this etching, the dielectric material layer remains substantially within the cavity 62, because of a small volume of the cavity. Generally, plasma dry etching etches a layer in wide and flat areas faster than a layer in concave (e.g., holes, grooves and/or slits) portions. Thus, the dielectric material layer can remain inside the cavities 62 as the inner spacers 64.

During the lateral etching (horizontally recessing) of the first semiconductor layers 20 and/or the etching process to form inner spacers 64, extruding end portions of the second semiconductor layers 25 may also be slightly trimmed. Nonetheless, end portions of the second semiconductor layers 25 may still extrude into the S/D trench 60 with respect to the inner spacers 64. In certain embodiments, end portions of the second semiconductor layers 25 extrude further into the S/D trench 60 with respect to an edge of the gate sidewall spacer 55. In the illustrated embodiment where three layers of the second semiconductor layers 25 are shown, the lateral proximity D1 measured from an edge of the gate sidewall spacer 55 to a tip of an end portion of the top layer is in a range from about 1 nm to about 3 nm, the lateral proximity D2 to a tip of an end portion of the middle layer is in a range from about 2 nm to about 6 nm, and the lateral proximity D3 to a tip of an end portion of the bottom layer is in a range from about 3 nm to about 10 nm. The misalignment introduces non-uniformity to the device 10, such as various channel lengths. Further, the extruding end portions represent a high resistance path between effective channel portion that is directly under a gate structure and to-be-formed S/D epitaxial features. Therefore, there is a need to shrink the extruding end portions to bring S/D epitaxial features closer to the channel region and to increase uniformity of channel lengths. Although a stronger and/or longer etching may shrink extruding end portions of the channel layers, but it also extends the S/D trench 60 deeper into the underneath substrate 12, which may cause punthrough leakage. As explained in greater detail below, an etch rate modulation by implanting etch rate modifying species into end portions of the channel layers together with a selective etching will be applied to selectively etch end portions of the channel layers.

Figure 13:
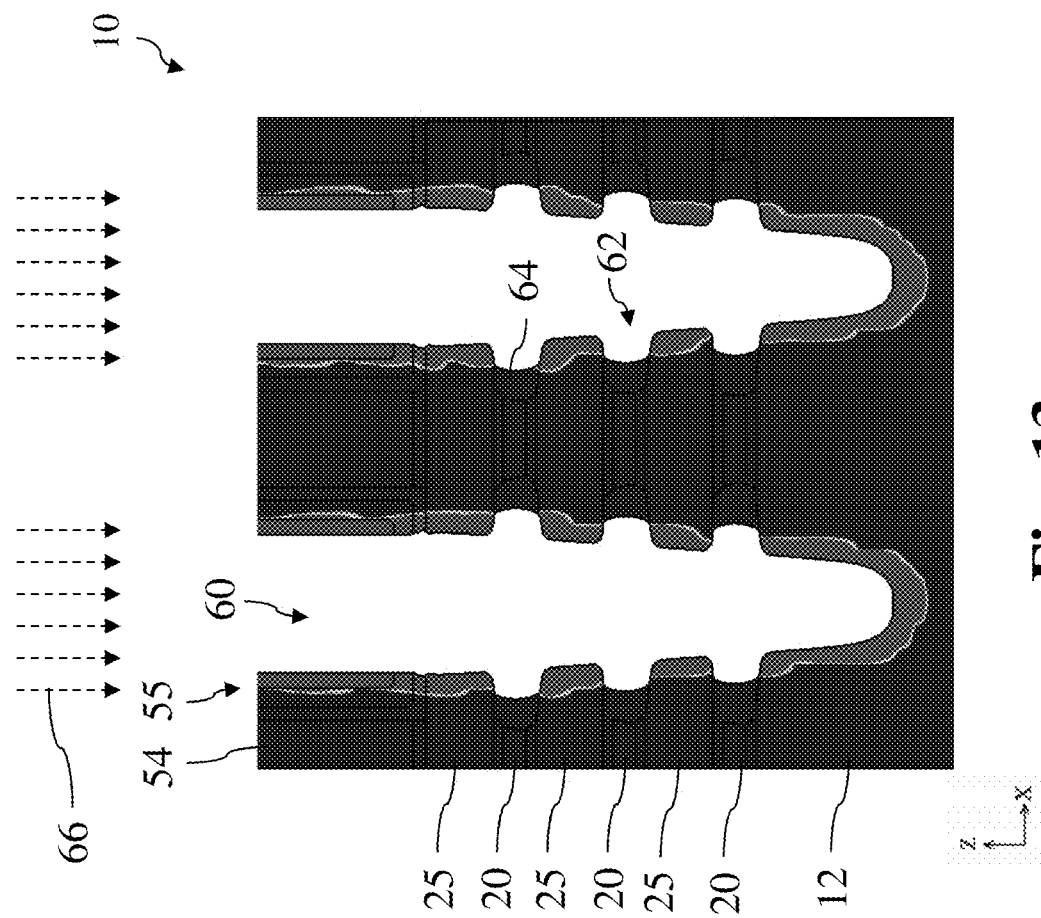

Referring to FIGS. 1B and 13, method 100 proceeds to operation 120 where an etch rate modifying species 66 is implanted into end portions of the second semiconductor layers 25. In some embodiments, an ion implantation process is performed to drive the etch rate modifying species 66. Ion implantation causes structural damages to existing bonds in semiconductor material in the semiconductor layers 25 (e.g., Si—Si bonds) via nuclear collisions. For semiconductor layers 25 comprising silicon in some embodiments, if the nuclear energy loss exceeds about 340 kJ/mol (corresponding to the Si—Si bonding energy in a unit volume of silicon), the etch rate of silicon is significantly enhanced. An ion implantation of etch rate modifying species 66, such as Arsenic (As), Boron (B), or Phosphorus (P), can be used to induce damage above the threshold level require for etch rate enhancement. In some embodiments, the etch rate modifying species 66 includes a mixture of As and B.

In some embodiments, the implantation process is performed as a blanket implant, such that the entirety of the surface of the device 10 is subjected to the implantation of the etch rate modifying species 66. The sacrificial gate structure 50 and the gate sidewall spacers 55 protects the stacked semiconductor layers 20 and 25 directly under from receiving the etch rate modifying species 66, while extruding end portions of the second semiconductor layers 25 exposed in the S/D trenches 60 receive the implantation. In other embodiments, the implantation may be selectively applied, such as by using a patterned mask (e.g., by reusing the mask for operation 114 in defining the S/D trench 60), to limit the implantation to the S/D trenches. In the illustrated embodiment as shown in FIG. 13, surface portions of the gate sidewall spacers 55, end portions of the second semiconductor layers 25, and the top surface of the substrate 12 exposed in the S/D trench 60 are doped with the etch rate modifying species 66. The patterned mask may exclude the inner spacers 64 from receiving implantation. In some embodiments, the implantation dose is in a range from about $5 \times 10^{15}$ cm$^{-2}$ to about $1 \times 10^{17}$ cm$^{-2}$. The etch rate modifying species 66 may have a higher concentration closer to the tip of the extruding end portions and decrease when further away from the tip due to diffusion. In some embodiments, the etch rate of the end portions of the second semiconductor layers 25 is increased about 5 to 10 times by the implantation of the etch rate modifying species 66. The etch rate of the dielectric material in the gate sidewall spacers 55 may substantially remain the same due to higher bonding energy.

Figure 14:
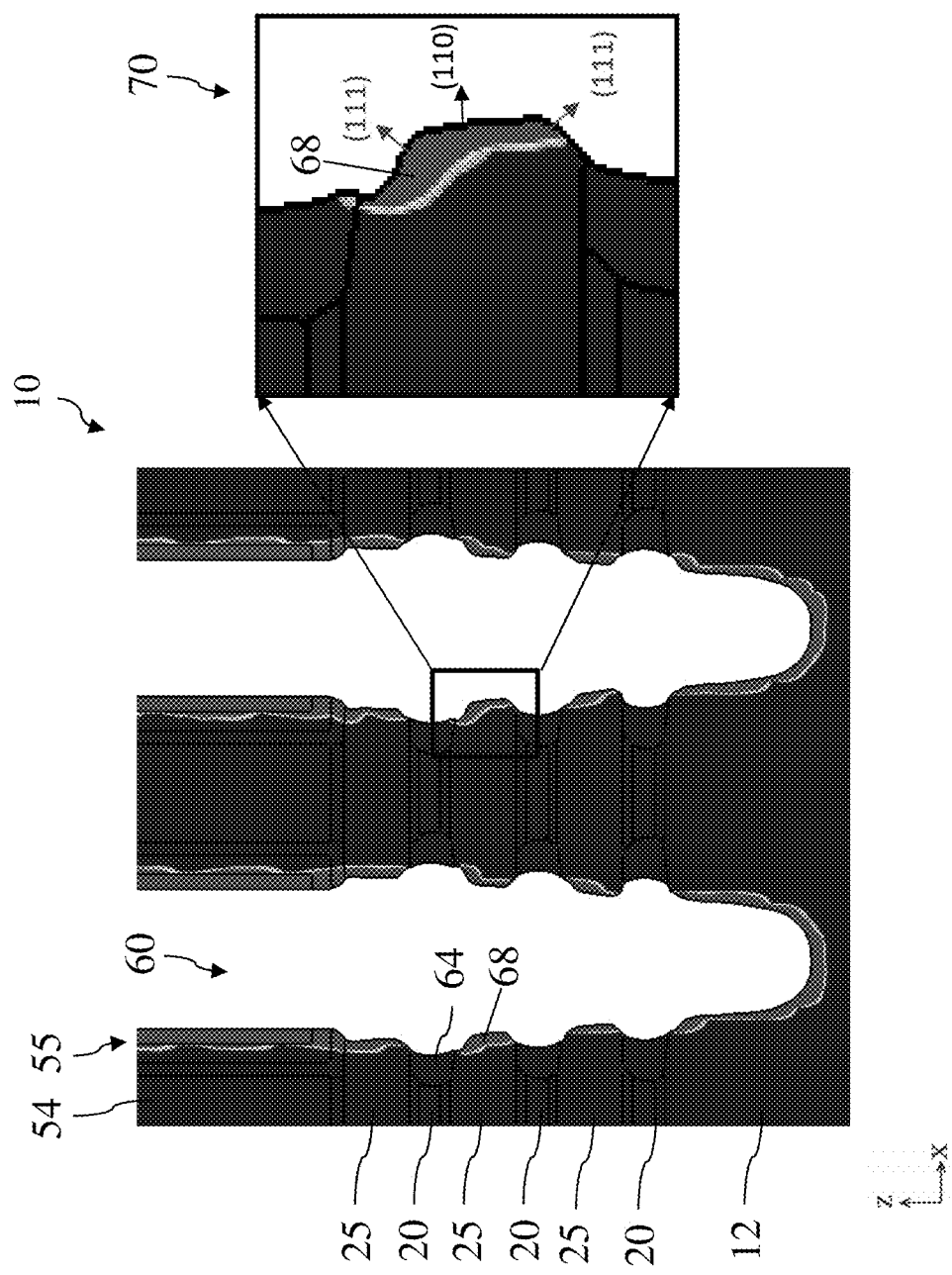

Referring to FIGS. 1B and 14, method 100 proceeds to operation 122 where a selective etching process is performed to laterally recess the extruding end portions of the second semiconductor layers 25. The etchant selectively targets at the implanted surface portion of the second semiconductor layers 25 and the substrate 12. The selective etching process may include wet etching, dry etching, reactive ion etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF), potassium hydroxide (KOH) solution, ammonia, a solution containing hydrofluoric acid (HF), nitric acid ($HNO_3$), and/or acetic acid ($CH_3COOH$), or other suitable wet etchants. In a specific example, the etching process is a wet etching process using $H_3PO_4$ or other suitable etchants.

Operation 122 may control the selective etching process to stop when concentration of the etch rate modifying species 66 decreases to a certain level. As a result, each of the gate sidewall spacers 55, end portions of the second semiconductor layers 25, and the top surface of the substrate 12 exposed in the S/D trench 60 may have a shallow surface portion 68 doped with the etch rate modifying species 66. The shallow surface portion 68 may have a thickness ranging from about 0.2 nm to about 1 nm in some embodiments. Other portions of the second semiconductor layers 25 may be substantially free of the etch rate modifying species 66.

Still referring to FIG. 14, after operation 122, the recessed end portions of the second semiconductor layers 25 are substantially flush with the edge (sidewall) of the gate sidewall spacer 55 in some embodiments. Here, "being substantially flush" means the difference in the relative position is less than about 1 nm. In some embodiments, by selecting an appropriate crystal orientation of the second semiconductor layers 25 and an etchant, the etched surface of the end portions of the second semiconductor layers 25 has a trapezoid defined by a first (111) facet, a (110) facet, and a second (111) facet, as shown in region 70. The first (111) facet and the second (111) facet intersect with the edge of respective neighboring inner spacer 64.

Figure 15:
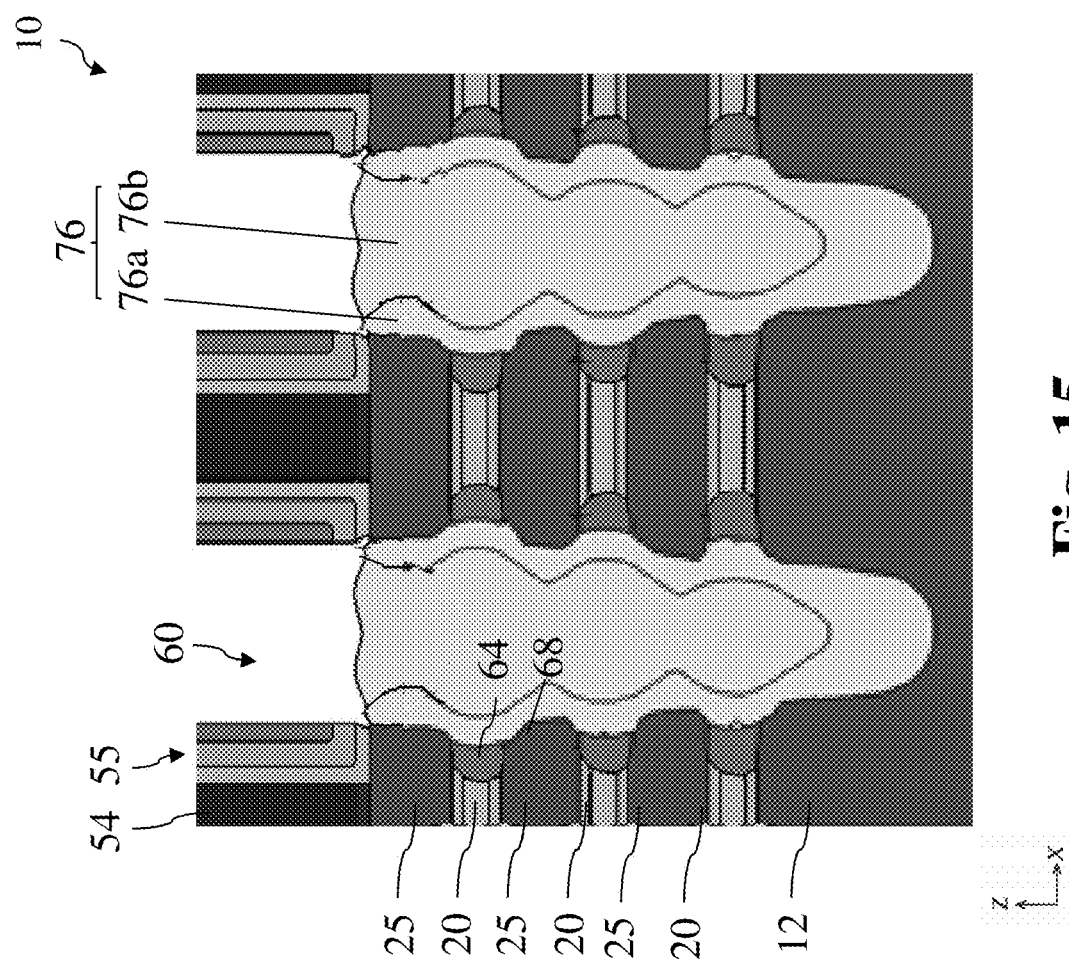

Referring to FIGS. 1B and 15, method 100 proceeds to operation 126 where an S/D epitaxial feature 76 is formed in the S/D trench 60. In an embodiment, forming the S/D epitaxial feature 76 includes epitaxially growing one or more semiconductor layers (e.g., layers 76a and 76b) by an MBE process, a chemical vapor deposition process, and/or other suitable epitaxial growth processes. In a further embodiment, the S/D epitaxial feature 76 is in-situ or ex-situ doped with an n-type dopant or a p-type dopant. For example, in some embodiments, the S/D epitaxial feature 76 includes silicon-germanium (SiGe) doped with boron for forming S/D features for a p-type FET. In some embodiments, the S/D epitaxial feature 76 includes silicon doped with phosphorous for forming S/D features for an n-type FET. In the illustrated embodiment, operation 126 first deposits semiconductor layer 76a in the S/D trench 60 and then deposits semiconductor layer 76b on the semiconductor layer 76a. In some embodiments, the semiconductor layers 76a and 76b differ in amount of dopant included therein. In some examples, the amount of dopant included in the semiconductor layer 76a is less than that included in the semiconductor layer 76b due to the nature of the doping process.

In some embodiments, the dopant in the S/D epitaxial feature 75 is p-type (e.g., boron) for an p-type FET, and the etch rate modifying species 66 doped in the shallow surface portion 68, which directly interfaces with the layer 76*a*, is the same type (e.g., boron as well). In some alternative embodiments, the etch rate modifying species 66 doped in the shallow surface portion 68 is an opposite type (e.g., phosphorus). The concentration of the dopant in the shallow surface portion 68 may be higher than both layers 76*a* and 76*b* in some embodiments. The concentration of the dopant in the shallow surface portion 68 may be higher than layer 76*a* but lower than layer 76*b* in some other embodiments.

In some other embodiments, the dopant in the S/D epitaxial feature 75 is n-type (e.g., phosphorus) for an n-type FET, and the etch rate modifying species 66 doped in the shallow surface portion 68, which directly interfaces with the layer 76*a*, is the same type (e.g., phosphorus as well). In some alternative embodiments, the etch rate modifying species 66 doped in the shallow surface portion 68 is an opposite type (e.g., boron). The concentration of the dopant in the shallow surface portion 68 may be higher than both layers 76*a* and 76*b* in some embodiments. The concentration of the dopant in the shallow surface portion 68 may be higher than layer 76*a* but lower than layer 76*b* in some other embodiments.

Figure 16:
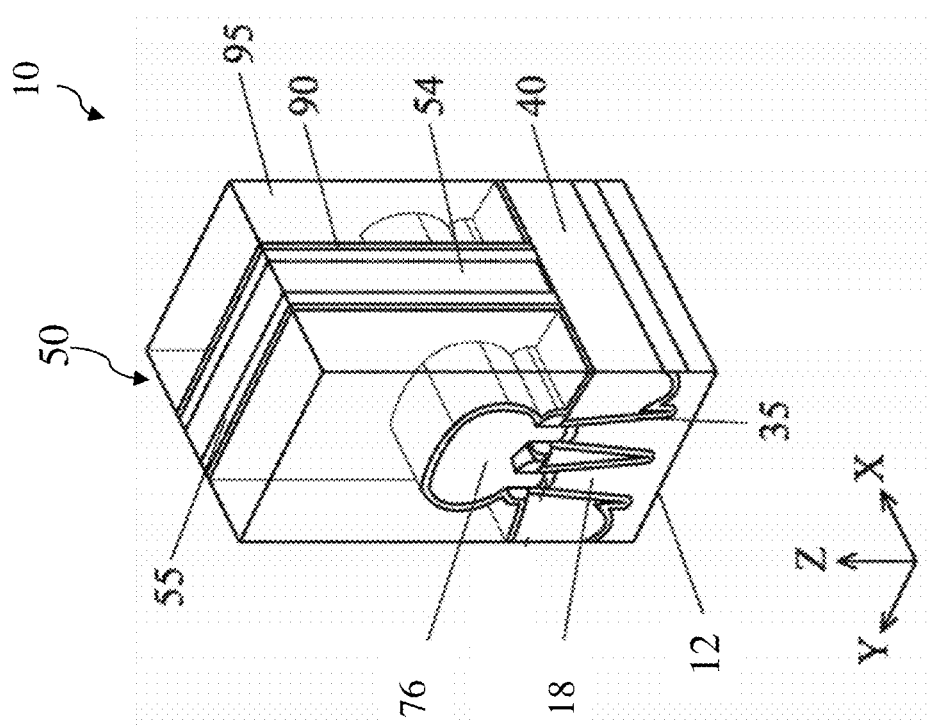

Referring to FIGS. 1B and 16, the method 100 then proceeds to operation 128 where an inter-layer dielectric (ILD) layer 95 is formed on the substrate. In some embodiments, a contact etch stop layer (CESL) 90 is also formed prior to forming the ILD layer 95. In some examples, the CESL 90 includes a silicon nitride layer, silicon oxide layer, a silicon oxynitride layer, and/or other materials known in the art. The CESL 90 may be formed by plasma-enhanced chemical vapor deposition (PECVD) process and/or other suitable deposition or oxidation processes. In some embodiments, the ILD layer 95 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 95 may be deposited by a PECVD process or other suitable deposition technique. In some embodiments, after formation of the ILD layer 95, the device 10 may be subject to a high thermal budget process to anneal the ILD layer 95. In some examples, after depositing the ILD layer 95, a planarization process may be performed to remove excessive dielectric materials. For example, a planarization process includes a chemical mechanical planarization (CMP) process which removes portions of the ILD layer 95 (and CESL layer, if present) overlying the sacrificial gate structure 50 and exposes the sacrificial gate electrode 54.

Figure 17:
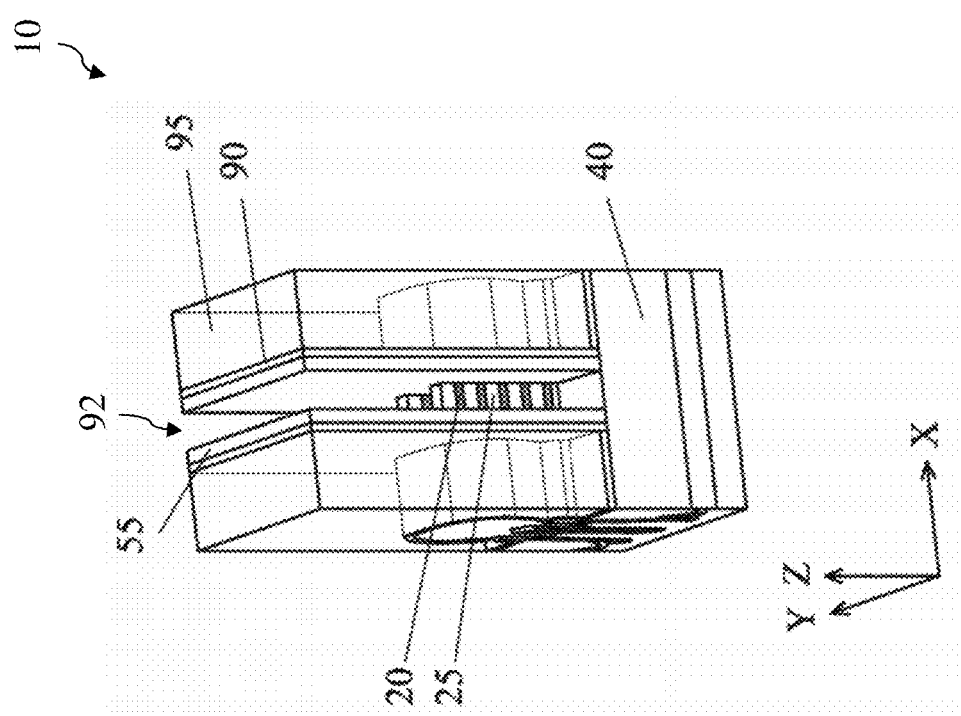

Referring to FIGS. 1B and 17, method 100 then proceeds to operation 130 by removing the sacrificial gate structure 50 to form a gate trench 92 in the channel region. A final gate structure (e.g., including a high-K dielectric layer and metal gate electrode) may be subsequently formed in the gate trench 92, as will be described below. Operation 130 may include one or more etching processes that are selective to the material in the sacrificial gate structure 50. For example, the removal of the sacrificial gate structure 50 may be performed using a selective etch process such as a selective wet etch, a selective dry etch, or a combination thereof. The stacked semiconductor layers 20 and 25 of the fin 30 are exposed in the gate trench 92.

Figure 18:
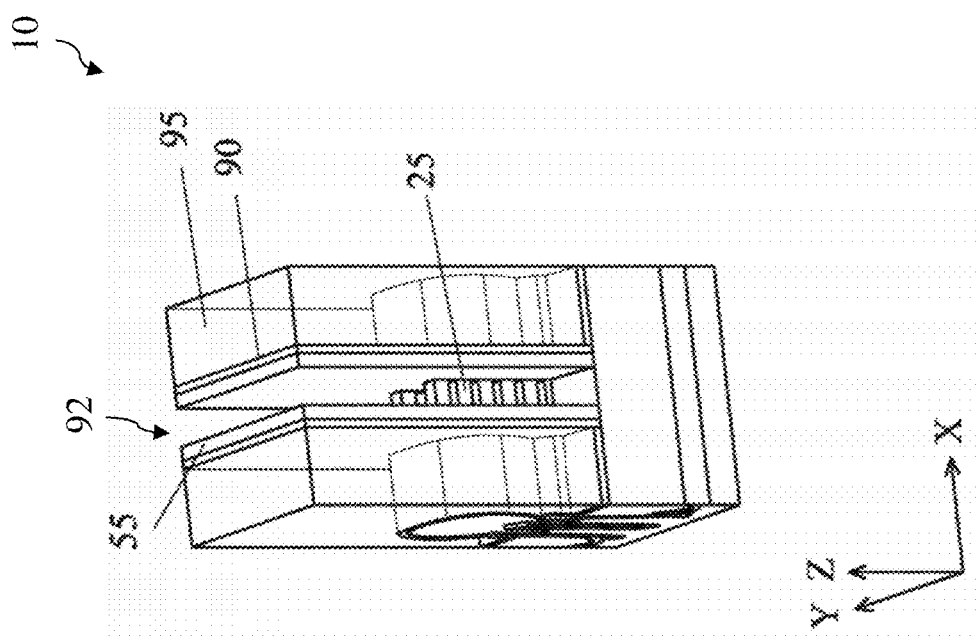

Referring to FIGS. 1B and 18, method 100 then proceeds to operation 132 by removing the first semiconductor layers 20 from the fins 30 in the gate trench 92 thereby forming channel members of the second semiconductor layers 25. In an embodiment, the first semiconductor layers 20 are removed by a selective wet etching process. In an embodiment, the first semiconductor layers 20 are SiGe and the second semiconductor layers 25 are silicon allowing for the selective removal of the first semiconductor layers 20 using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. In some embodiments, the selective wet etching includes an APM etch (e.g., ammonia hydroxide-hydrogen peroxide-water mixture). In the present embodiment, since the inner spacer layer 64 is formed, the etching of the first semiconductor layers 20 stops at the inner spacer layer 64. Since the etching of the first semiconductor layers 20 stop at the inner spacer layer 64, it is possible to prevent the gate electrode and the S/D epitaxial features from contacting or bridging.

Figure 19:
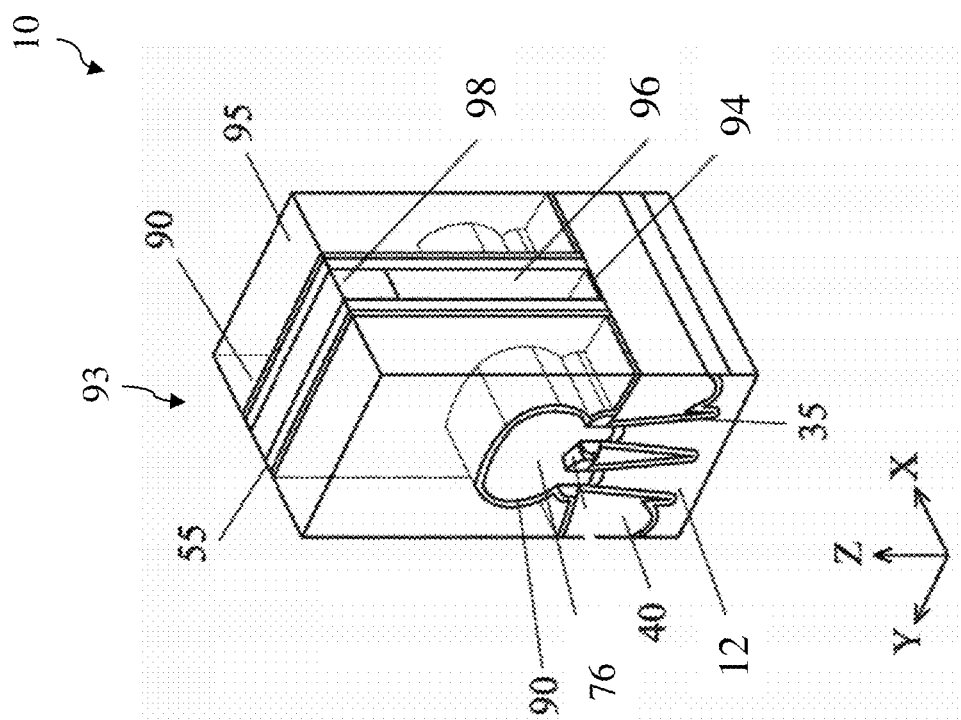

Referring to FIGS. 1B and 19, method 100 then proceeds to operation 134 where a gate structure 93 is formed. The gate structure 93 may be a high-K/metal gate (HK MG) stack, however other compositions are possible. In some embodiments, after the multi-channels provided by the plurality of channel members (now having gaps therebetween due to the removing of the first semiconductor layers 20) of the second semiconductor layers 25 are formed, a gate dielectric layer 94 is formed around each channel members, and a gate electrode 96 is formed on the gate dielectric layer 94.

In certain embodiments, the gate dielectric layer 94 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 94 includes an interfacial layer formed between the channel layers and the dielectric material. The gate dielectric layer 94 may be formed by CVD, ALD or any suitable method. In one embodiment, the gate dielectric layer 94 is formed using a highly conformal deposition process such as ALD in order to ensure the formation of a gate dielectric layer having a uniform thickness around each channel layers. The thickness of the gate dielectric layer 94 is in a range from about 1 nm to about 6 nm in one embodiment.

The gate electrode 96 is formed on the gate dielectric layer 94 to surround each channel member. The gate electrode 96 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 96 may be formed by CVD, ALD, electro-plating, or other suitable method. The gate electrode 96 is also deposited over the upper surface of the ILD layer 95. The gate dielectric layer and the gate electrode layer formed over the ILD layer 95 are then planarized by using, for example, CMP, until the top surface of the ILD layer 95 is revealed.

After the planarization operation, the gate electrode 96 is recessed and a cap insulating layer 98 is formed over the recessed gate electrode 96. The cap insulating layer 98 includes one or more layers of a silicon nitride-based material, such as SiN. The cap insulating layer 98 can be formed by depositing an insulating material followed by a planarization operation.

In certain embodiments of the present disclosure, one or more work function adjustment layers (not shown) are interposed between the gate dielectric layer 94 and the gate electrode 96. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

The device 10 as shown in FIG. 19 may undergo further processing to form various features and regions known in the art. For example, subsequent processing may form contact openings, contact metal, as well as various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 20:
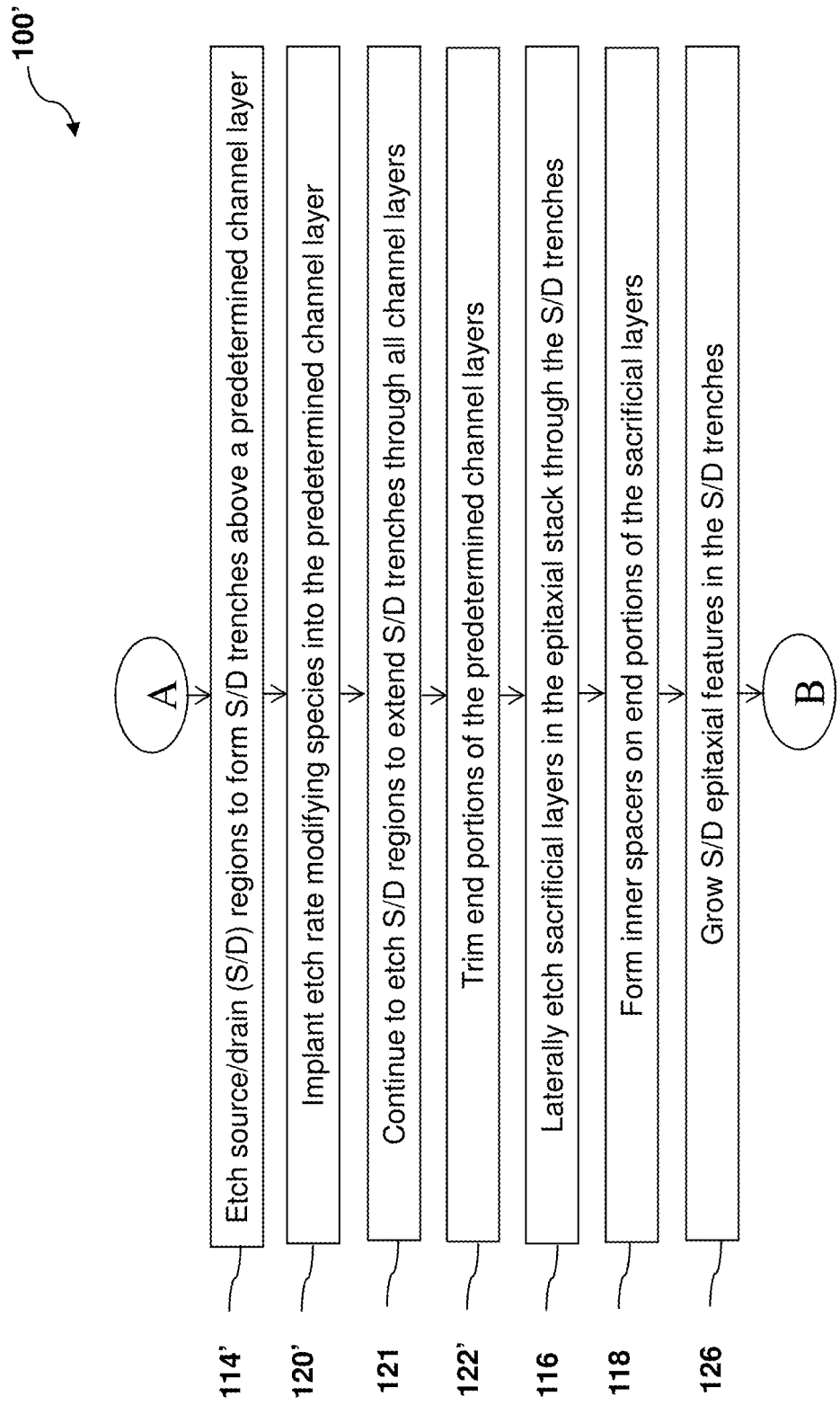
FIG. 20 shows a flow chart of another method for forming a multi-gate device, according to one or more aspects of the present disclosure.

In method 100, etch rate modulation is applied to each channel layer. Alternatively, etch rate modulation may be applied to one specific channel layer but substantially not to others. By doing so, only extruding end portions of the selected channel layer will be trimmed, which is effective in fine tuning channel length of a specific channel layer. For example, experiments or circuit simulations may reveal that a middle channel layer exhibits a relatively higher resistant path than upper and lower channel layers. An etch rate modulation may target specifically at the middle channel layer to recess its end portions to reduce channel resistance, which in turn increases driving current in this particular channel layer. FIG. 20 shows a flow chart of such alternative method 100' of forming an embodiment of the device 10, according to various aspects of the present disclosure. It is understood that additional operations can be provided before, during, and after operations/processes described herein, and some of the operations described below can be replaced or eliminated, for additional embodiments of the method. The order of the operations/processes may be interchangeable. Method 100' includes operations 102-112 and operations 128-134, which are substantially the same as those described above with reference to FIGS. 2-9 and 16-19 and will be omitted for the sake of simplicity. Other aspects of method 100' that are different from method 100 will be described in more details below.

The method 100' is described below with reference to FIG. 20, in conjunction with FIGS. 21-34. FIGS. 21-34 are cross-sectional views of embodiments of the device 10 along a cut (e.g., cut X1-X1 in FIG. 10A), which is along a lengthwise direction of the channel and perpendicular to a top surface of the substrate. Particularly, FIGS. 21-26 are associated with an embodiment of the device 10 where an etch rate modulation targets at a middle channel layer; FIGS. 27-30 are associated with another embodiment of the device 10 where an etch rate modulation targets at a topmost channel layer; FIGS. 31-34 are associated with yet another embodiment of the device 10 where an etch rate modulation targets at a bottommost channel layer.

Figure 21:
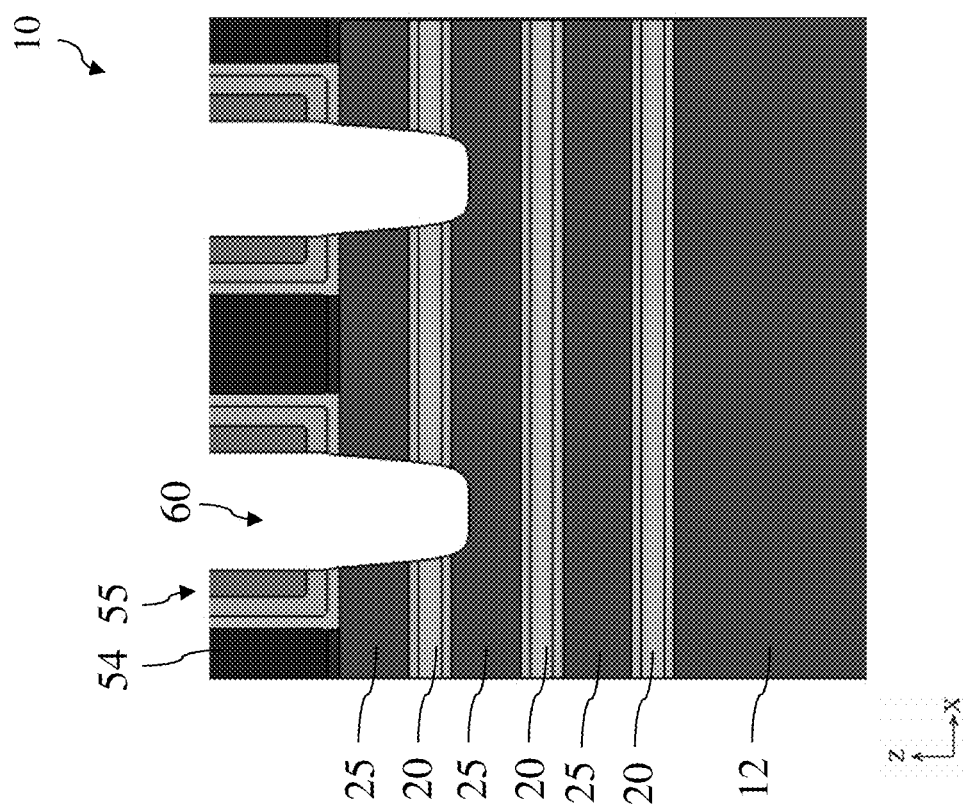

Referring to FIGS. 20 and 21 where the predetermined channel layer to receive etch rate modulation is a middle channel layer, method 100' at operation 114' forms an S/D trench 60. Different with operation 114 in method 100, operation 114' does not etch through the stacked structure of the semiconductor layers 20 and 25. Operation 114' etches the stacked semiconductor layers 20 and 25 above the middle channel layer, by using one or more lithography and etching operations. In the illustrated embodiment, the middle second semiconductor layer 25 is also partially etched.

Figure 22:
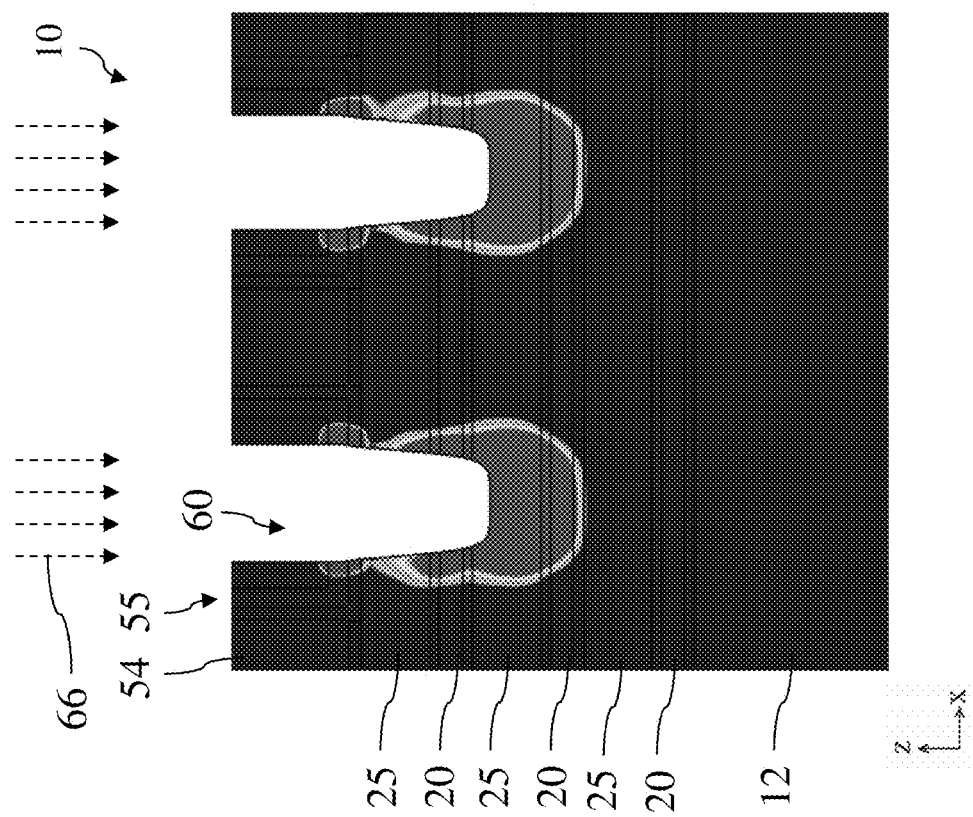
FIGS. 21, 22, 23, 24, 25, 26, 27, 28, 29, 30, 31, 32, 33, and 34 illustrate cross-sectional views of various embodiments of a semiconductor structure during a fabrication process according to the method of FIG. 20, according to aspects of the present disclosure.

Referring to FIGS. 20 and 22, method 100' proceeds to operation 120' where an etch rate modifying species 66 is implanted into the middle second semiconductor layer 25. In some embodiments, an ion implantation process is performed to drive the etch rate modifying species, such as As, B, or P, or a combination thereof. The implantation may be selectively applied, such as by using a patterned mask (e.g., by reusing the mask for operation 114' in defining the S/D trench 60), to limit the implantation to the S/D trench 60. The implantation is configured at a depth equal to or slightly larger than the thickness of the middle second semiconductor layer 25. In the illustrated embodiment as shown in FIG. 22, the neighboring first semiconductor layer 20 underneath also receives the etch rate modifying species 66, but not for the neighboring second semiconductor layer 25 underneath. Due to the loading effects during etching operations in forming the S/D trench 60, the S/D trench 60 generally has a larger opening on its top than its bottom. Consequently, the implanted portion of the second semiconductor layer 25 is wider than the opening at the bottom of the S/D trench 60. In the illustrated embodiment as shown in FIG. 22, a lower portion of the lateral ends of the topmost second semiconductor layer 25 may also receive the etch rate modifying species 66.

Figure 23:
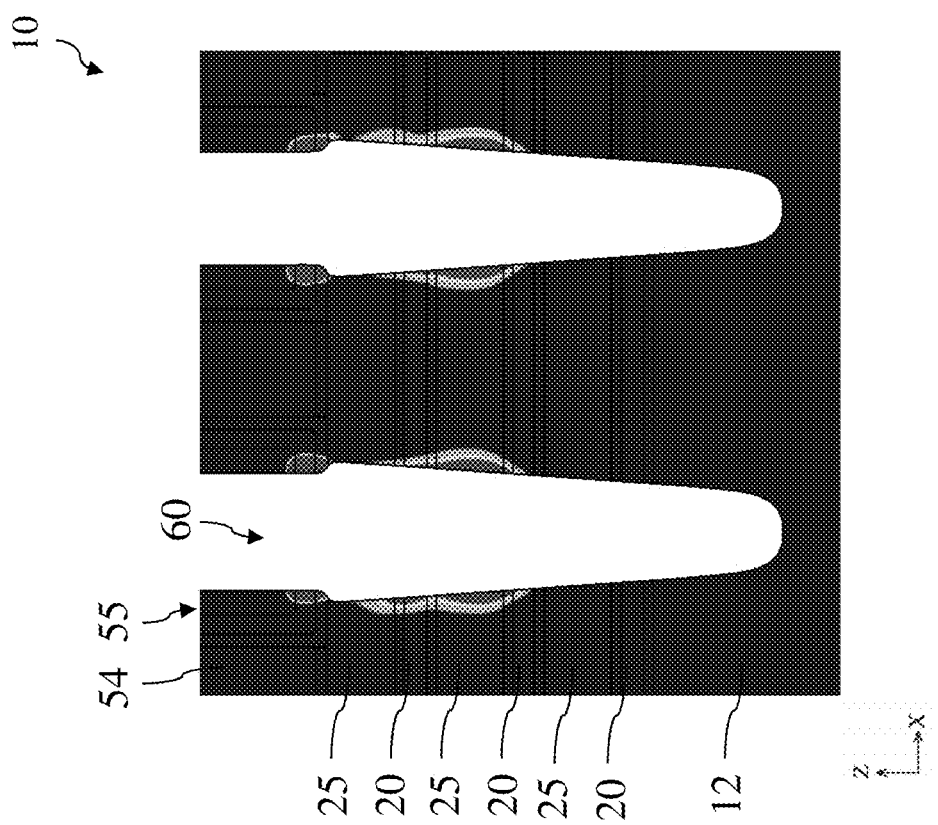

Referring to FIGS. 20 and 23, method 100' proceeds to operation 121 where the S/D trench 60 is extended downwardly through the stacked structure of the semiconductor layers 20 and 25, by using one or more lithography and etching operations. In the illustrated embodiment, the substrate 12 (or the bottom part 18 of the fin structure) is also partially etched. Since the implanted portion of the second semiconductor layer 25 is wider than the opening of the S/D trench 60 in the middle, end portions of the second semiconductor layer 25 in the middle remains doped with the etch rate modifying species 66.

Figure 24:
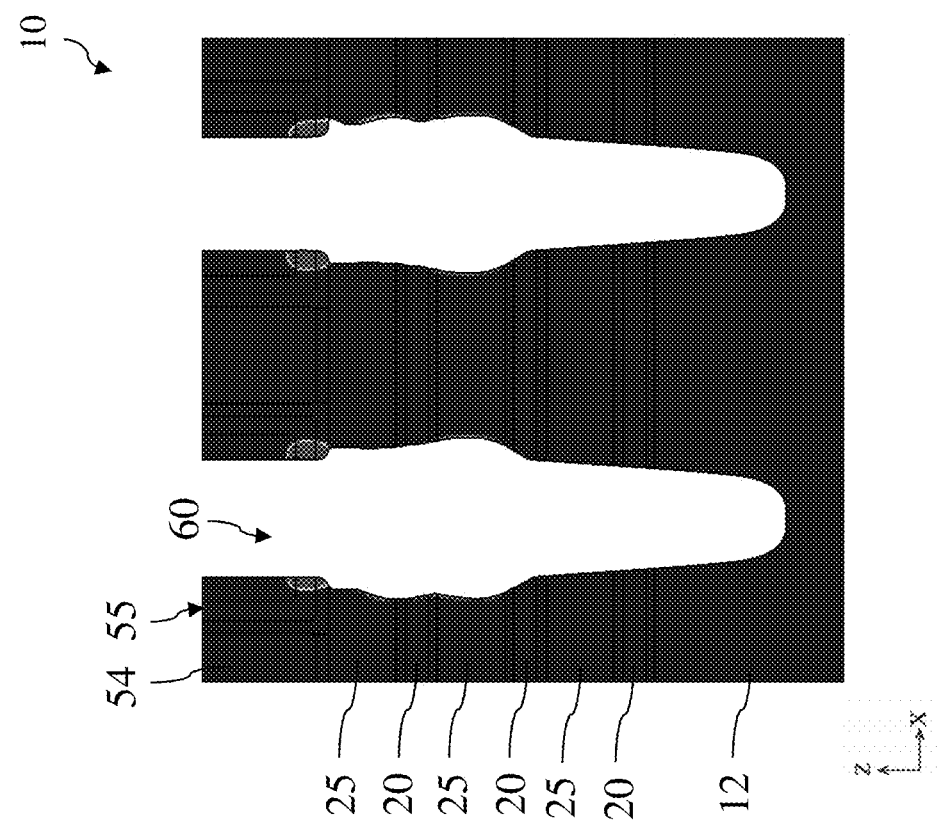

Referring to FIGS. 20 and 24, method 100' proceeds to operation 122' where a selective etching process is performed to laterally recess the implanted end portions of the middle second semiconductor layers 25. Similar to operation 122 in method 100, operation 122' applies an etchant that selectively targets at the implanted end portions. The selective etching process may include wet etching, dry etching, reactive ion etching, or other suitable etching methods. Different with operation 122 in method 100, operation 122' does not substantially etch upper and lower second semiconductor layers 25 where no etch rate modifying species 66 is implanted. In some embodiments, a lower portion of the lateral ends of the topmost second semiconductor layer 25 that have received the etch rate modifying species 66 may also be partially recessed.

Figure 26:
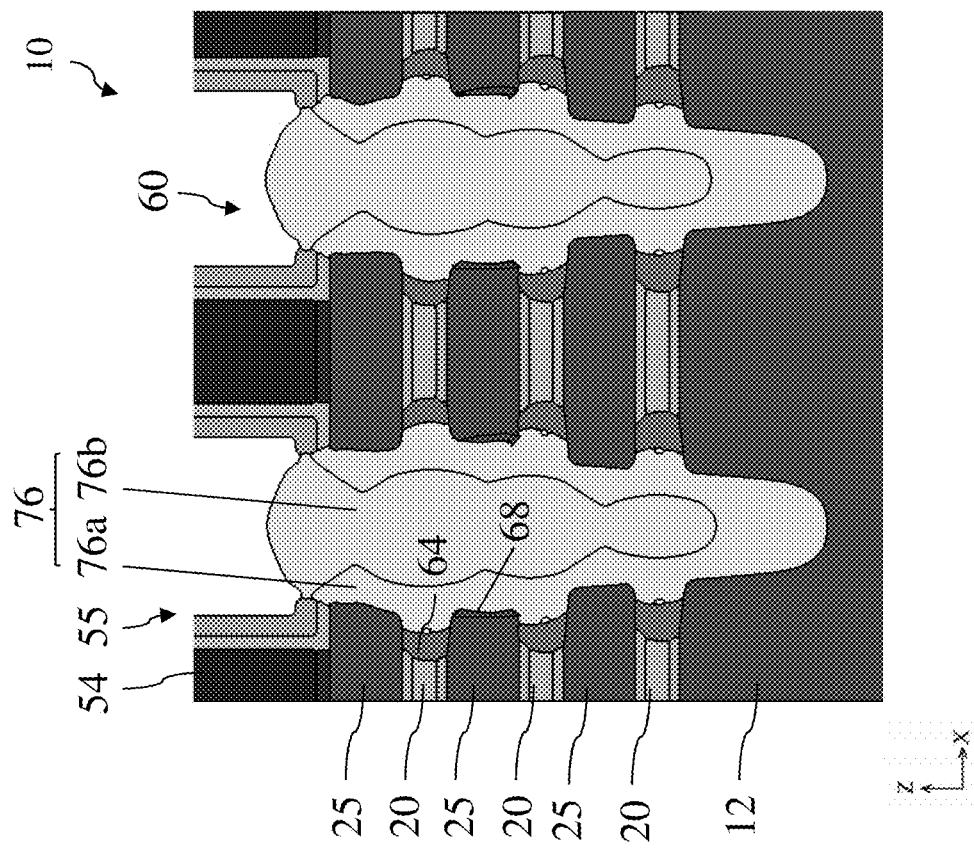
Figure 25:
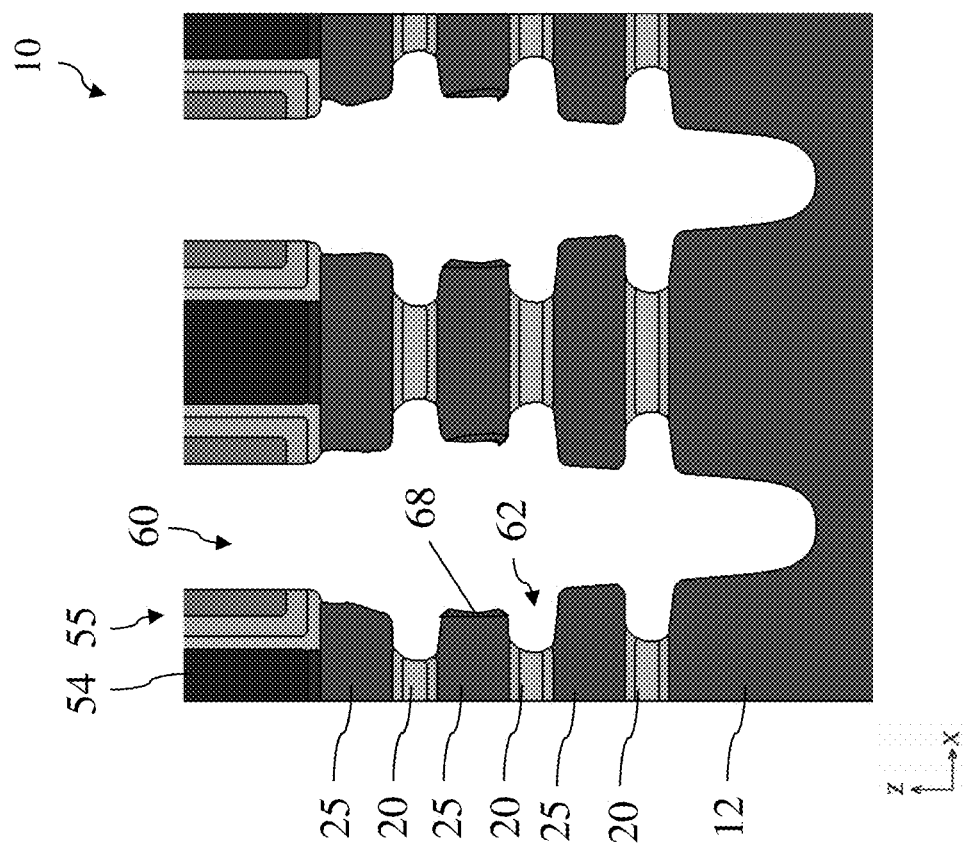

Referring to FIGS. 20 and 25-26, method 100' proceeds to operations 116, 118, and 126 where end portions of the first semiconductor layers 20 are laterally etched and deposited with inner spacers 64 and an S/D epitaxial feature 76 is formed in the S/D trench 60. Operations 116, 118, and 126 of method 100' are substantially similar to operations 116, 118, and 126 of method 100 discussed above.

Still referring to FIG. 26, depending on the selective etching depth in operation 122', end portions of the middle second semiconductor layer 25 may have a shallow surface portion 68 doped with the etch rate modifying species 66, but not in other upper and lower second semiconductor layers 25. The shallow surface portion 68 directly interfaces with the S/D epitaxial feature 76. The etch rate modifying species 66 in the shallow surface portion 68 may be the same type as the dopants in the S/D epitaxial feature 76, or an opposite type. The etch rate modifying species concentration in the shallow surface portion 68 may be higher than both layers 76a and 76b of the S/D epitaxial feature 76 or may be high than layer 76a but lower than layer 76b in some embodiments. Also, since end portions of the middle second semiconductor layer 25 have been further recessed, the middle semiconductor layer 25 provides the shortest channel layer among all. In some embodiments, end portions of the middle second semiconductor layer 25 are directly under or substantially flush with the edge (sidewall) of the gate sidewall spacers 55, while end portions of the upper and lower second semiconductor layers 25 extrude away from the edge of the gate sidewall spacers 55 into the S/D epitaxial feature 76. In furtherance of some embodiments, the lower second semiconductor layers 25 extrudes further into the S/D epitaxial feature 76 than upper second semiconductor layers 25.

Figure 28:
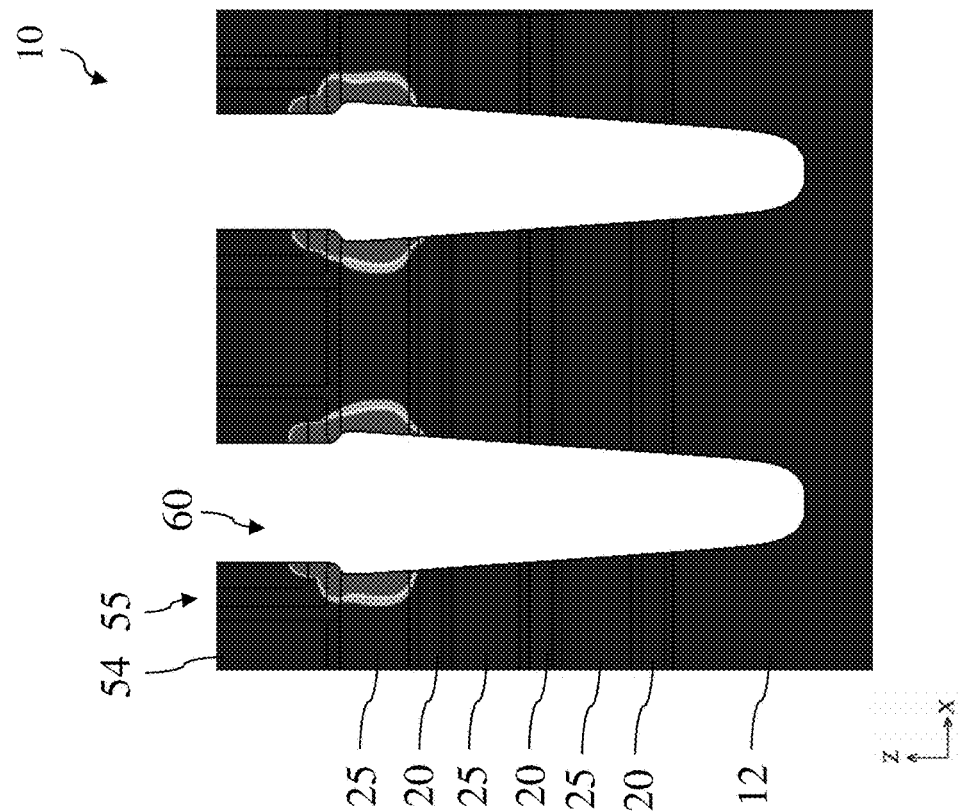
Figure 27:
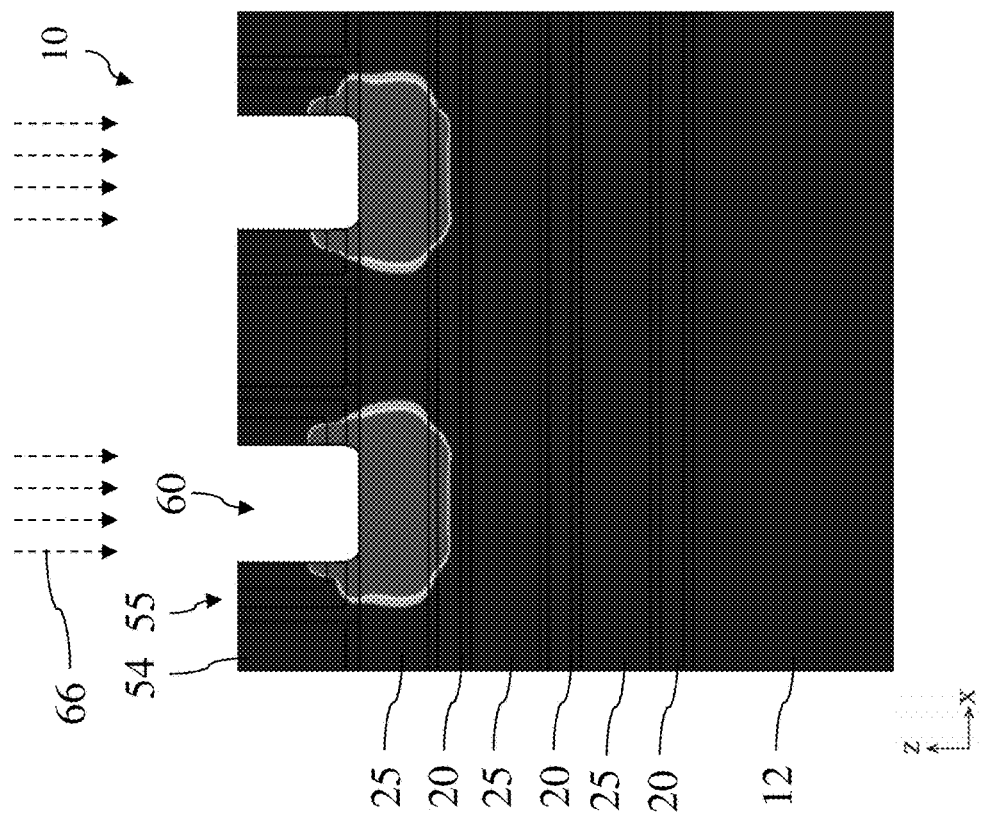
Figure 30:
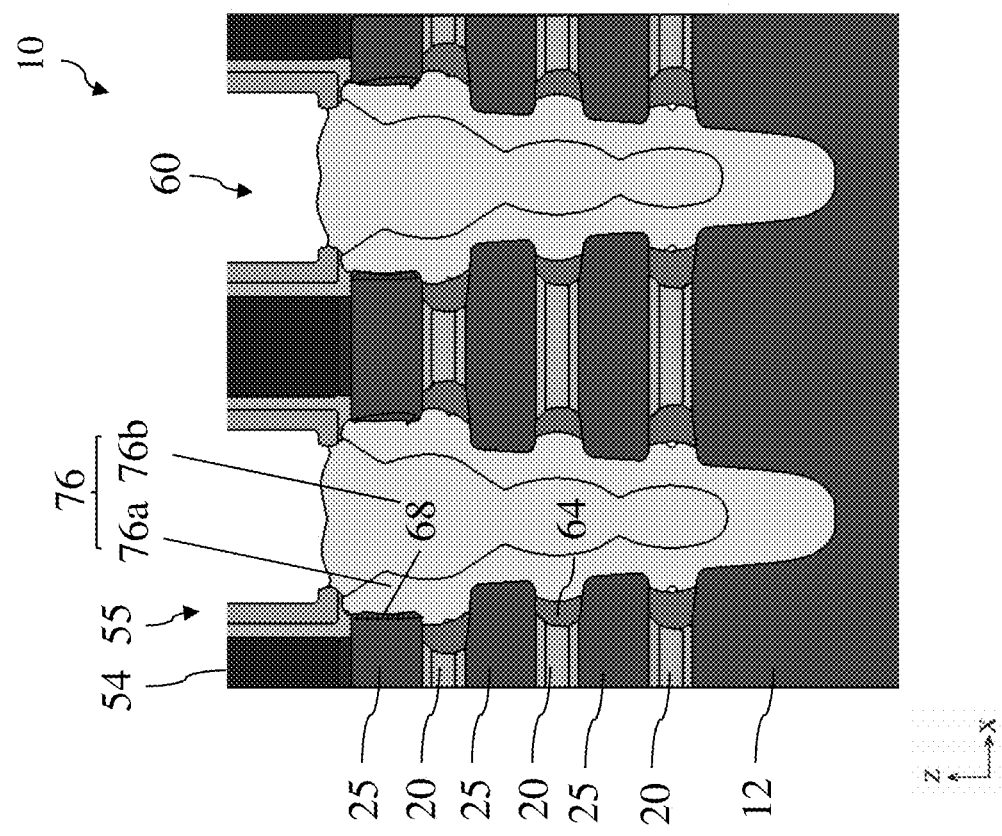
Figure 29:
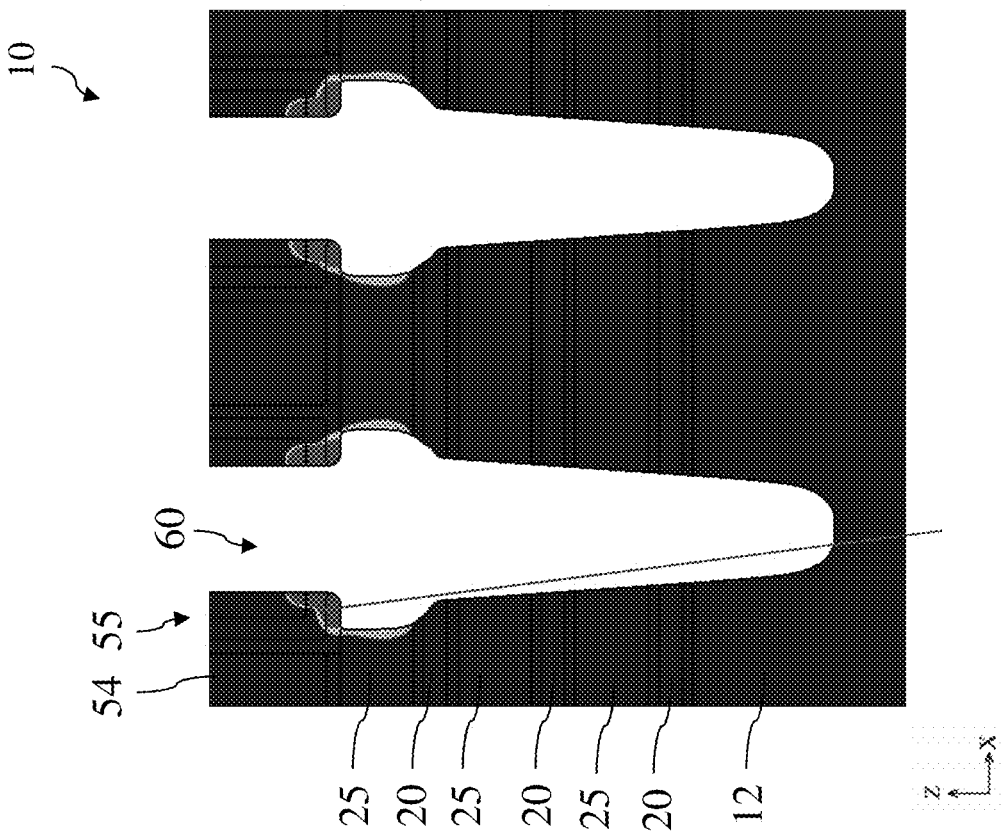

Alternatively, FIGS. 27-30 are associated with another embodiment of the method 100' where an etch rate modulation targets at a topmost channel layer of the device 10. Referring to FIG. 27, gate sidewall spacers 55 are etched to initially form an S/D trench 60 to expose the topmost second semiconductor layer 25 and an etch rate modifying species 66 is then implanted into the topmost second semiconductor layer 25 though the opening of the S/D trench 60. Referring to FIG. 28, the stacked structure of the semiconductor layers 20 and 25 is etched down at the S/D regions, by using one or more lithography and etching operations, thereby forming an S/D trench 60. At this stage, end portions of the stacked semiconductor layers 20 and 25 are exposed in the S/D trench 60, while the end portions of the topmost second semiconductor layer 25 have been implanted with the etch rate modifying species 66. Referring to FIG. 29, a selective etching process is performed to laterally recess the implanted end portions of the topmost second semiconductor layers 25. Referring to FIG. 30, method 100' proceeds to operations 116, 118, and 126 where end portions of the first semiconductor layers 20 are laterally etched and deposited with inner spacers 64 and an S/D epitaxial features 76 is formed in the S/D trench 60.

Still referring to FIG. 30, depending on the selective etching depth in operation 122', end portions of the topmost second semiconductor layer 25 may have a shallow surface portion 68 doped with the etch rate modifying species 66, but not in other lower second semiconductor layers 25. The shallow surface portion 68 directly interfaces with the S/D epitaxial feature 76. The etch rate modifying species 66 in the shallow surface portion 68 may be the same type as the dopants in the S/D epitaxial feature 76, or an opposite type. The etch rate modifying species concentration in the shallow surface portion 68 may be higher than both layers 76a and 76b of the S/D epitaxial feature 76 or may be high than layer 76a but lower than layer 76b in some embodiments. Also, since end portions of the topmost second semiconductor layer 25 have been further recessed, the topmost semiconductor layer 25 provides the shortest channel layer among all. In some embodiments, end portions of the topmost second semiconductor layer 25 are directly under or substantially flush with the edge (sidewall) of the gate sidewall spacers 55, while end portions of other lower second semiconductor layers 25 extrude away from the edge of the gate sidewall spacers 55 into the S/D epitaxial feature 76. In furtherance of some embodiments, the bottommost second semiconductor layer 25 extrudes more than any upper second semiconductor layer 25.

Figure 32:
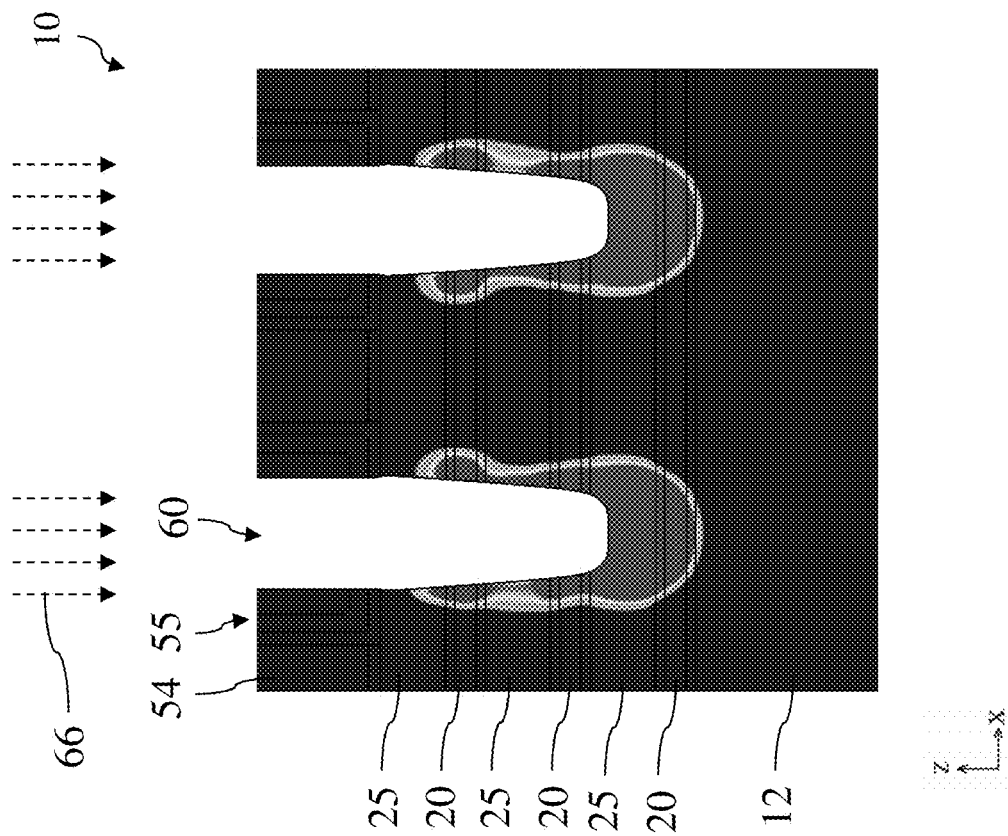
Figure 31:
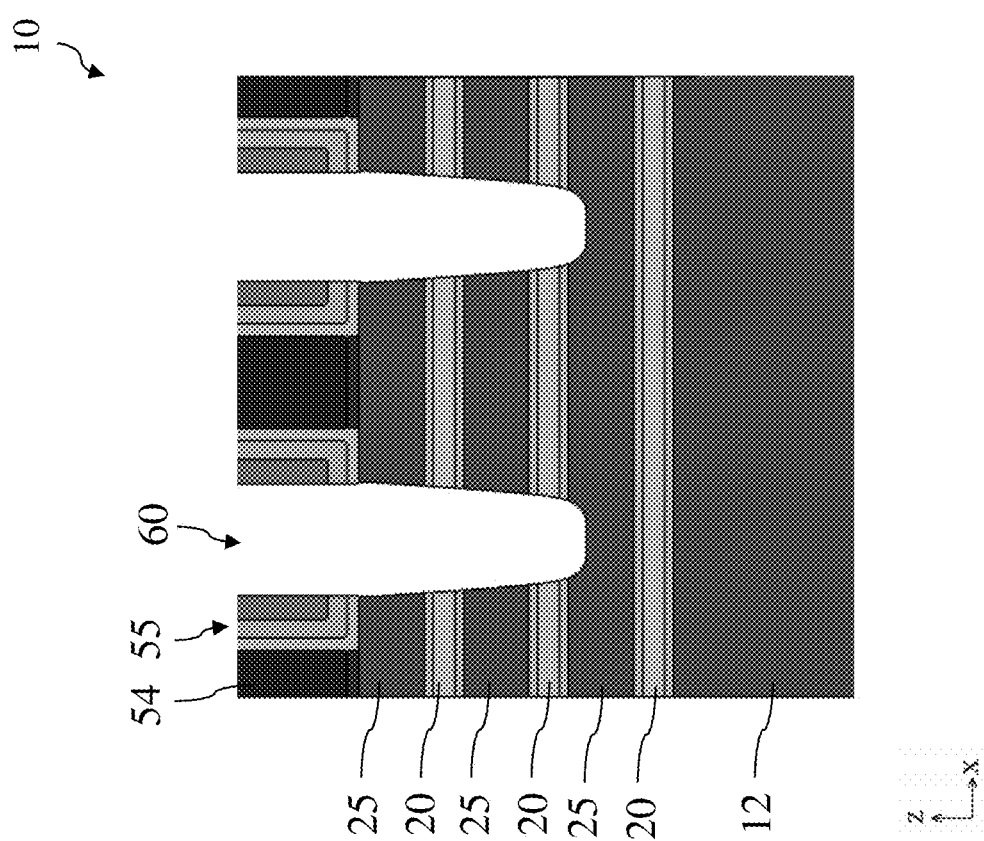
Figures 33, 34:
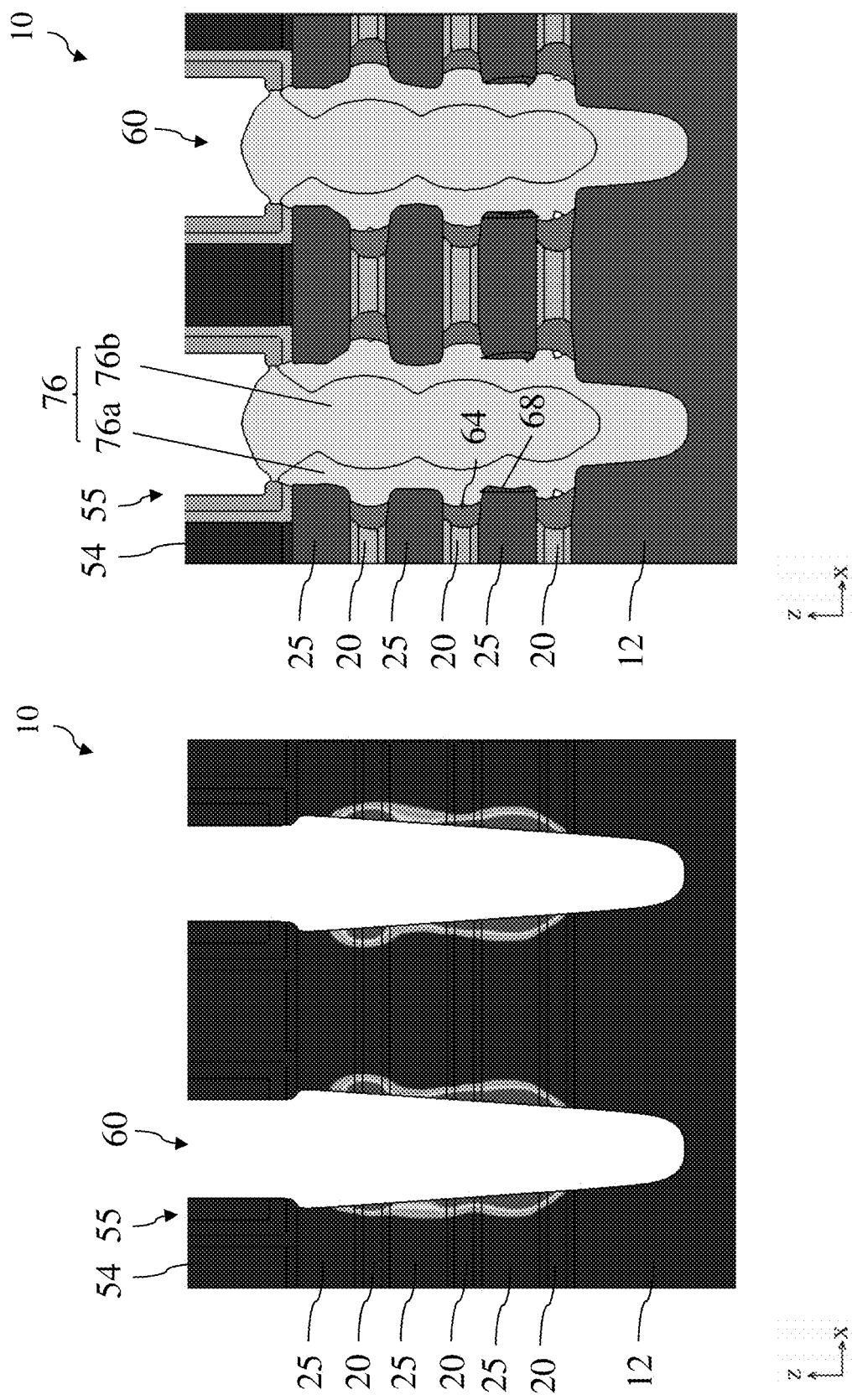

Alternatively, FIGS. 31-34 are associated with another embodiment of the method 100' where an etch rate modulation targets at a bottommost channel layer of the device 10. Referring to FIG. 31, the portion of the stacked structure of semiconductor layers 20 and 25 that is above the bottommost channel layer is etched to form S/D trenches 60 at the S/D regions, by using one or more lithography and etching operations. In the illustrated embodiment, the bottommost second semiconductor layer 25 is also partially etched. Referring to FIG. 32, an etch rate modifying species 66 is implanted into the bottommost second semiconductor layer 25. Referring to FIG. 33, the S/D trench 60 is extended downwardly through the stacked structure of the semiconductor layers 20 and 25, by using one or more lithography and etching operations. In the illustrated embodiment, the substrate 12 (or the bottom part 18 of the fin structure) is also partially etched. Referring to FIG. 34, a selective etching process is performed to laterally recess the implanted end portions of the bottommost second semiconductor layers 25. Subsequently, end portions of the first semiconductor layers 20 are laterally etched and deposited with inner spacers 64 and an S/D epitaxial features 76 is formed in the S/D trench 60.

Still referring to FIG. 34, depending on the selective etching depth in operation 122', end portions of the bottommost second semiconductor layer 25 may have a shallow surface portion 68 doped with the etch rate modifying species 66, but not in other upper second semiconductor layers 25. The shallow surface portion 68 directly interfaces with the S/D epitaxial feature 76. The etch rate modifying species 66 in the shallow surface portion 68 may be the same type as the dopants in the S/D epitaxial feature 76, or an opposite type. The etch rate modifying species concentration in the shallow surface portion 68 may be higher than both layers 76a and 76b of the S/D epitaxial feature 76 or may be high than layer 76a but lower than layer 76b in some embodiments. Also, since end portions of the bottommost second semiconductor layer 25 have been further recessed, the bottommost semiconductor layer 25 provides the shortest channel layer among all. In some embodiments, end portions of the bottommost second semiconductor layer 25 are directly under or substantially flush with the edge (sidewall) of the gate sidewall spacer 55, while end portions of the upper second semiconductor layers 25 extrude away from the edge of the gate sidewall spacer 55 into the S/D epitaxial feature 76. In furtherance of some embodiments, the middle second semiconductor layer 25 may provide the longest channel layer among all.

Figure 35:
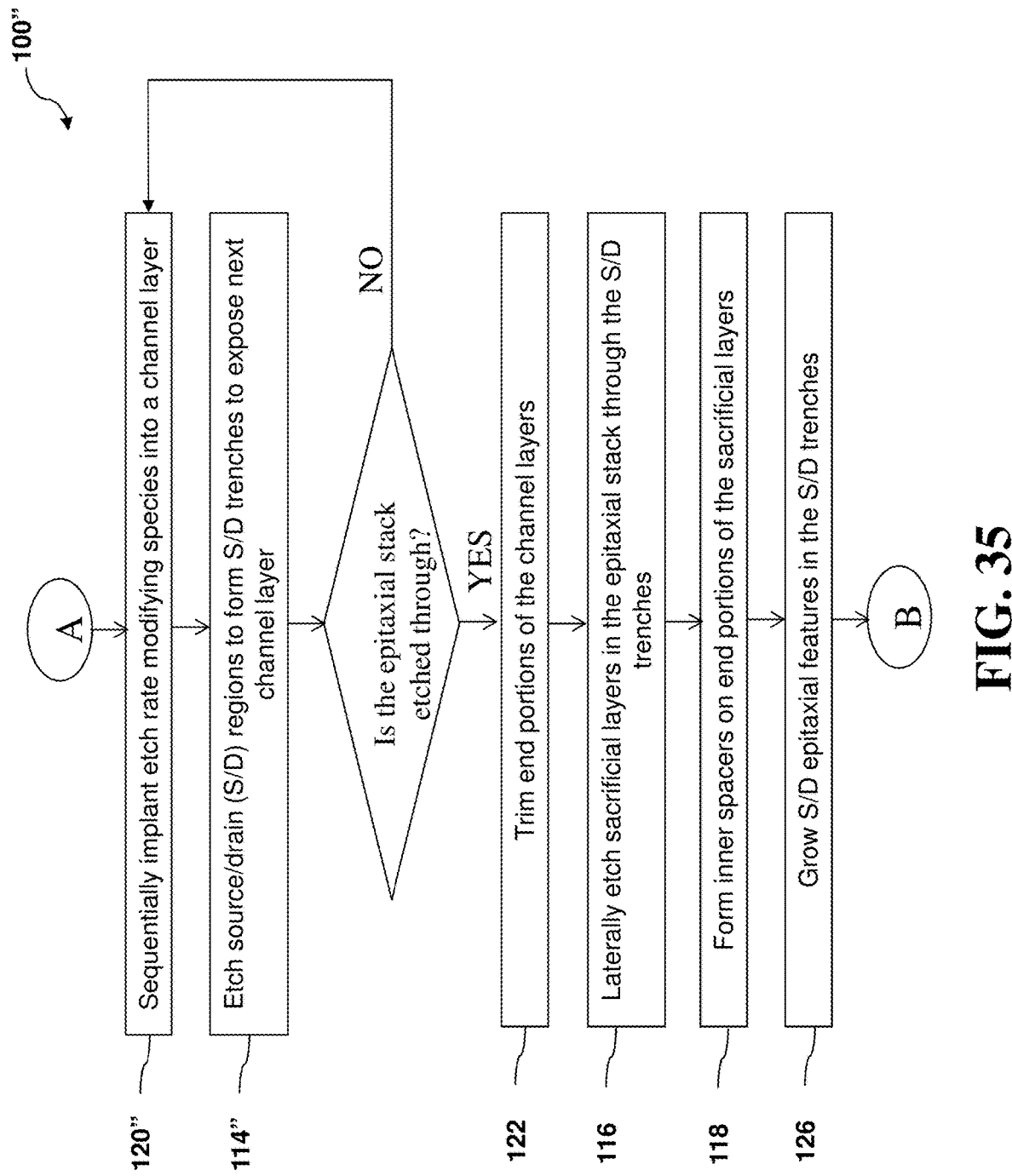
FIG. 35 shows a flow chart of yet another method for forming a multi-gate device, according to one or more aspects of the present disclosure.

FIG. 35 shows a flow chart of another method 100" of forming an embodiment of the device 10, where etch rate modulation can be applied individually to each channel layer in a cyclic process flow, according to various aspects of the present disclosure. It is understood that additional operations can be provided before, during, and after operations/processes described herein, and some of the operations described below can be replaced or eliminated, for additional embodiments of the method. The order of the operations/processes may be interchangeable. Method 100″ includes operations 102-112 and operations 128-134, which are substantially the same as those described above with reference to FIGS. 2-9 and 16-19 and will be omitted for the sake of simplicity. Other aspects of method 100″ that are different from method 100 will be described in more details below. The method 100″ is described below with reference to FIG. 35, in conjunction with FIGS. 36-43. FIGS. 36-43 are cross-sectional views of an embodiment of the device 10 along a cut (e.g., cut X1-X1 in FIG. 10A), which is along a lengthwise direction of the channel and perpendicular to a top surface of the substrate.

Figure 36:
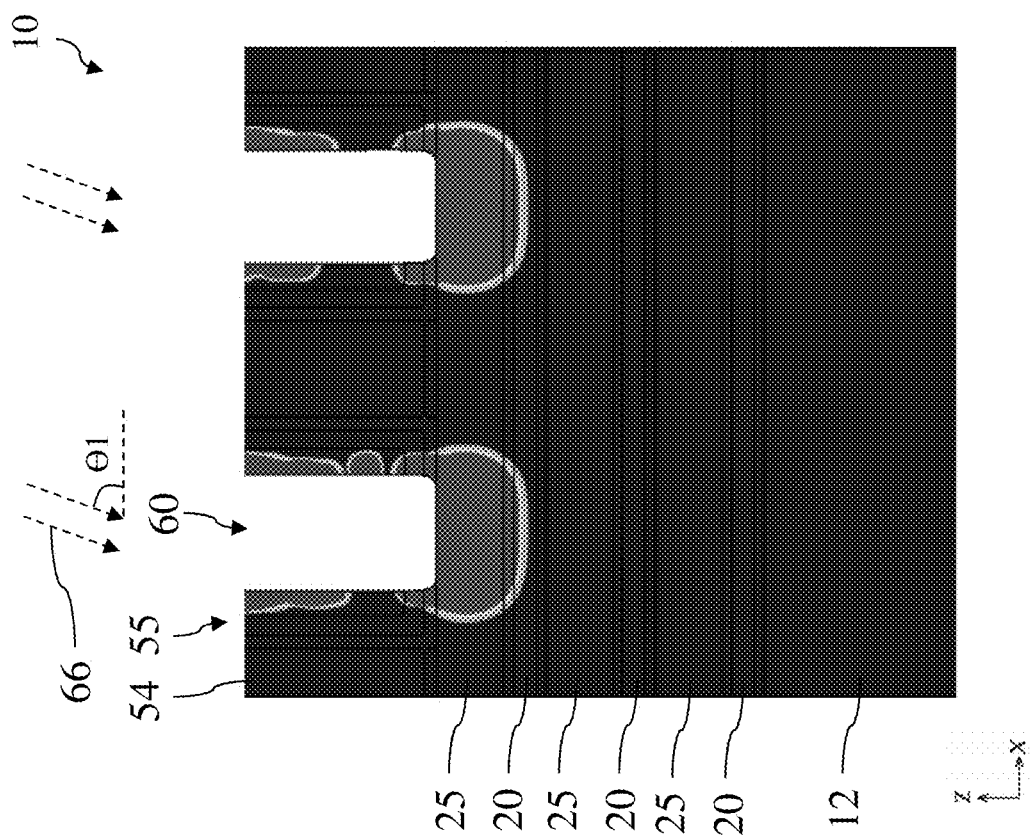

Referring to FIGS. 35 and 36, method 100″ proceeds to operation 120″ where gate sidewall spacers 55 are etched to initially form an S/D trench 60 to expose the topmost second semiconductor layer 25 and an etch rate modifying species 66 is then implanted into the topmost second semiconductor layer 25. In some embodiments, an ion implantation process is performed to drive the etch rate modifying species, such as As, B, or P, or a combination thereof. The implantation may be selectively applied, such as by using a patterned mask to limit the implantation to the S/D trenches. Further, the implantation process may include a slanted implantation with an implantation angle θ1 with respect to a top surface of the substrate 12, which is to focus the implantation to portions of the topmost second semiconductor layer 25 that will become end portions of the respective channel layer, but not to other channel layers. In the illustrated embodiment as shown in FIG. 36, the neighboring first semiconductor layer 20 underneath also receives the etch rate modifying species 66, but not for the neighboring second semiconductor layer 25 underneath.

Figure 37:
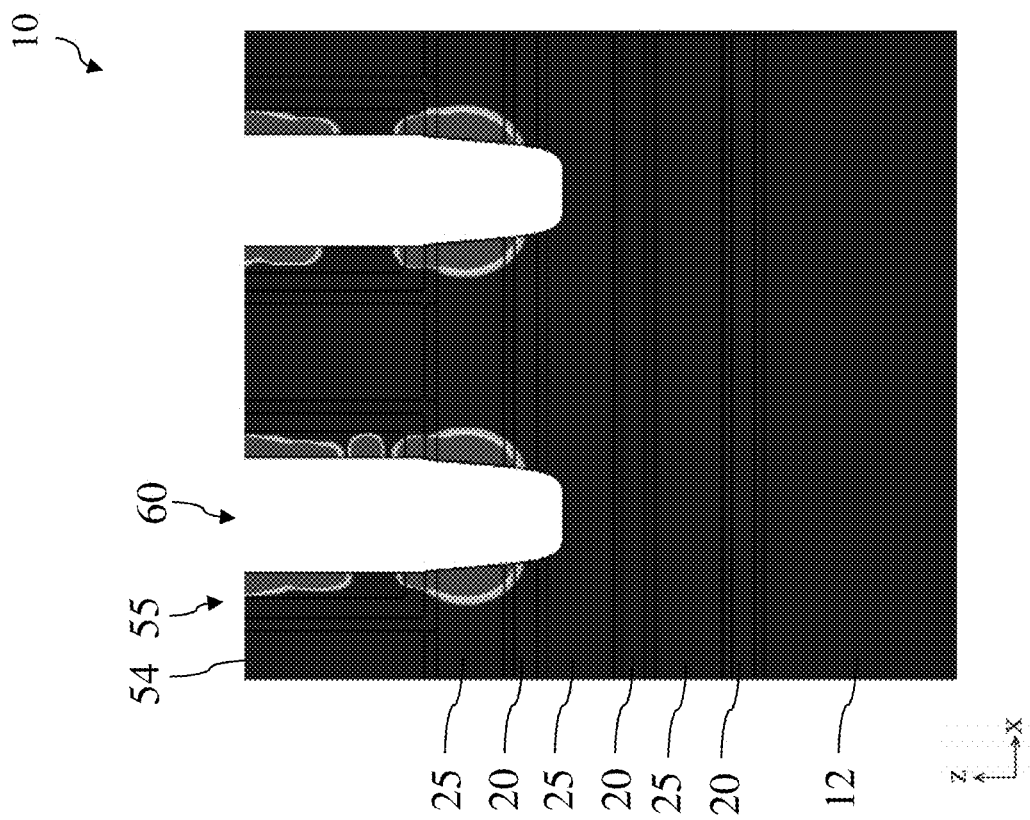
FIGS. 36, 37, 38, 39, 40, 41, 42, and 43 illustrate cross-sectional views of a semiconductor structure during a fabrication process according to the method of FIG. 35, according to aspects of the present disclosure.

Referring to FIGS. 35 and 37, method 100″ proceeds to operation 114″ where the topmost semiconductor layers 20 and 25 are etched at the S/D regions to form an S/D trench 60, by using one or more lithography and etching operations. The next second semiconductor layer 25 underneath is exposed in the S/D trench 60. In the illustrated embodiment, the next second semiconductor layer 25 underneath is also partially etched. Since the portion of the topmost second semiconductor layer 25 receiving the etch rate modifying species 66 is wider than the opening of the S/D trench 60, after operation 114″ end portions of the topmost second semiconductor layer 25 still has the implanted etch rate modifying species 66 therein.

Figure 39:
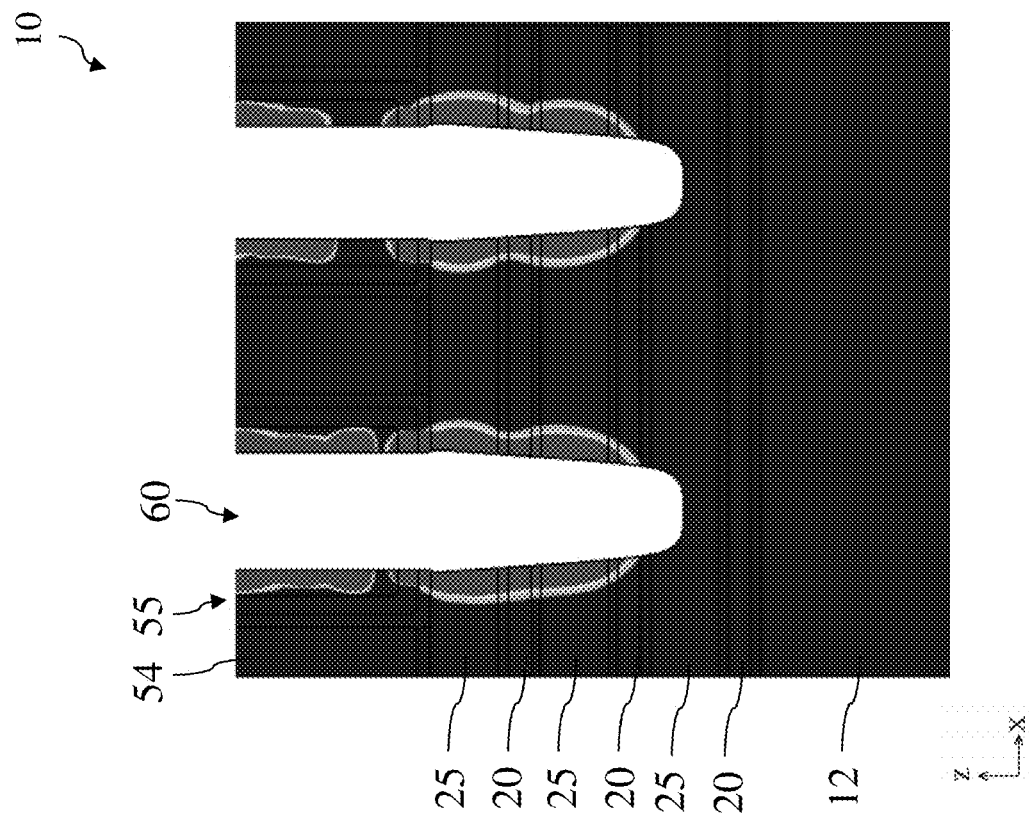
Figure 38:
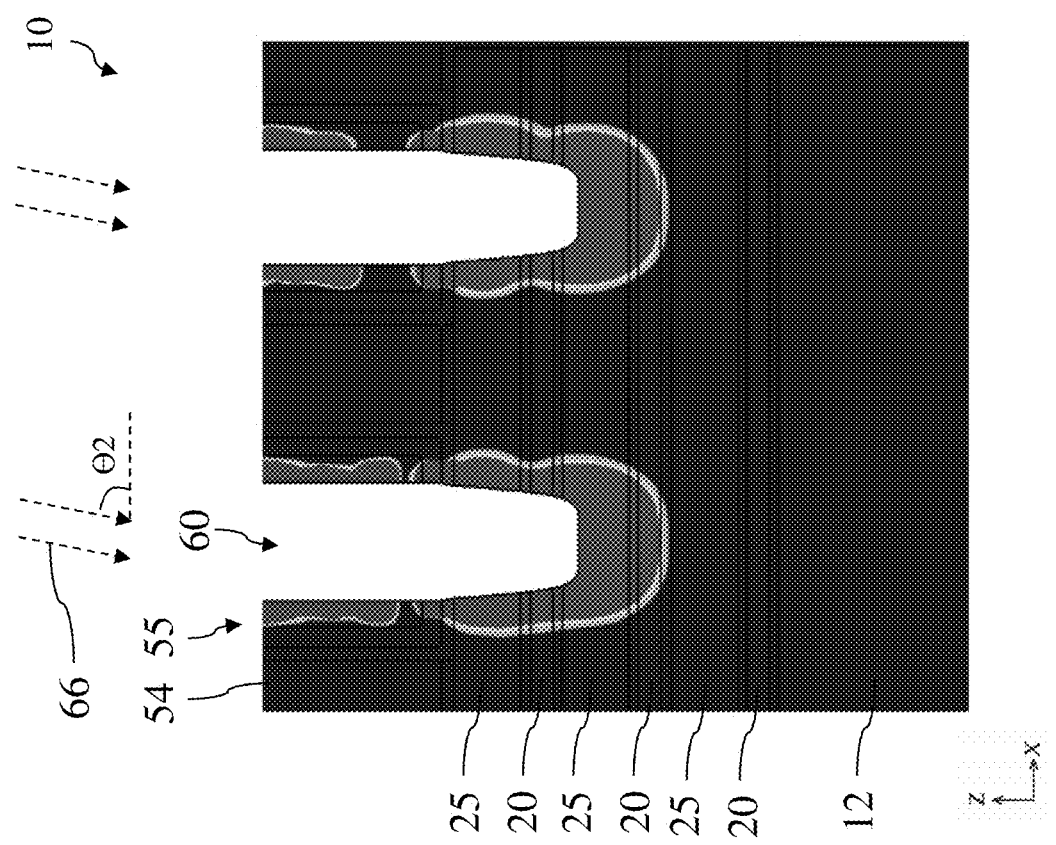
Figures 40, 41:
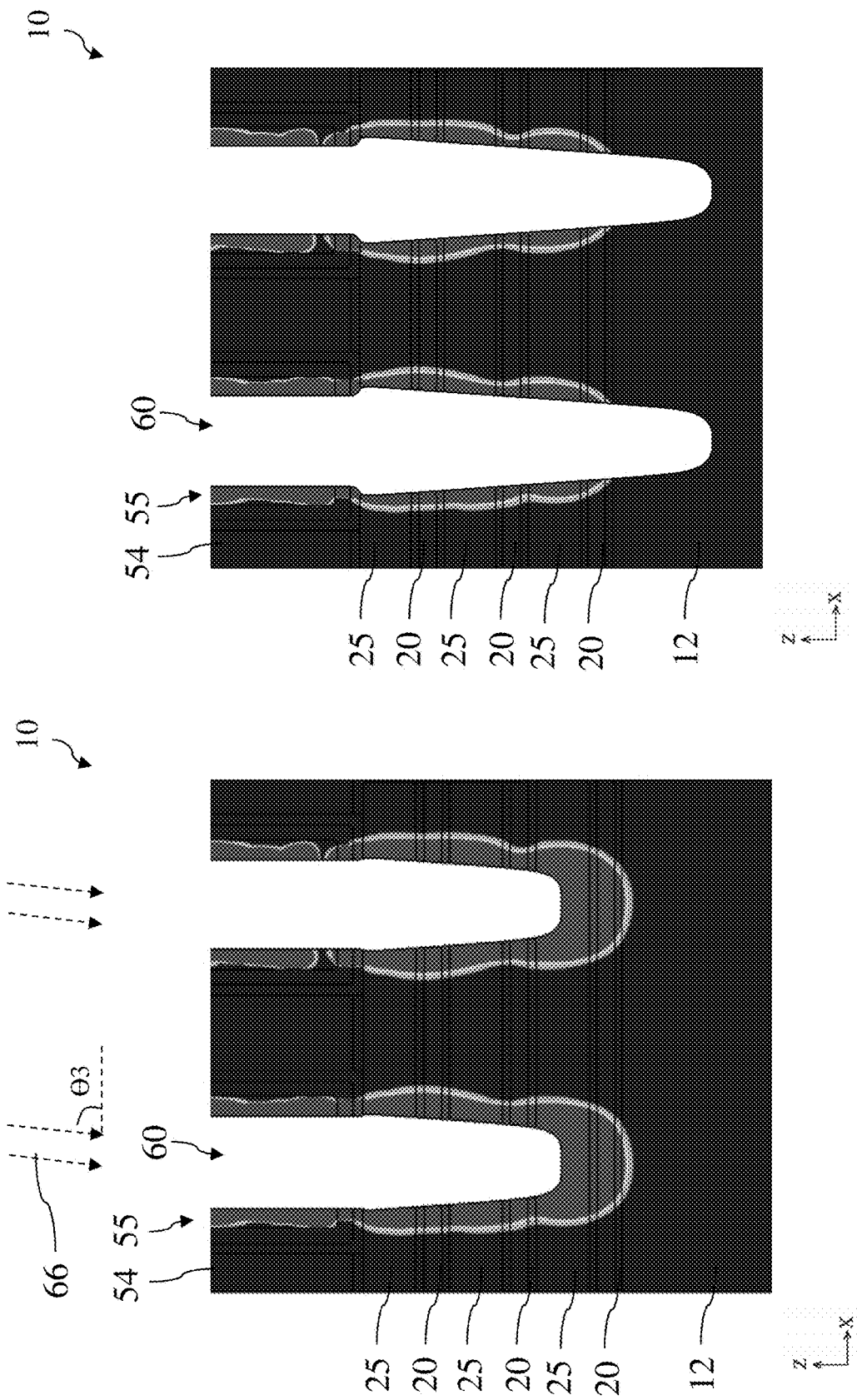

Subsequently, method 100″ repeats operation 120″ and operation 114″ sequentially to underneath second semiconductor layers 25 in a cyclic process flow for etch rate modulation. The cyclic process may be performed in-situ. For example, as illustrated in FIGS. 38 and 39, the etch rate modifying species 66 is implanted into the middle second semiconductor layer 25. The implantation angle may be tilted with an angle θ2 with respect to a top surface of the substrate 12 to focus the implantation to portions of the middle second semiconductor layer 25 that will become end portions of the respective channel layer, but not to other channel layers. In some embodiments, angle θ2 is larger than previous angle θ1. Further, the implantation process may use a dose individually different for each channel layer to fine tune each channel length. Still further, the implantation process may have an implantation depth individually different for each channel layer. Also, as illustrated in FIGS. 40 and 41, the etch rate modifying species 66 is implanted into the bottommost second semiconductor layer 25. The implantation angle may be tilted with an angle θ3 with respect to a top surface of the substrate 12 to focus the implantation to portions of the bottommost second semiconductor layer 25 that will become end portions of the respective channel layer. In some embodiments, angle θ3 is larger than previous angle θ2. Again, the implantation process may use a dose and implantation depth individually different for each channel layer to fine tune each channel length.

Figure 42:
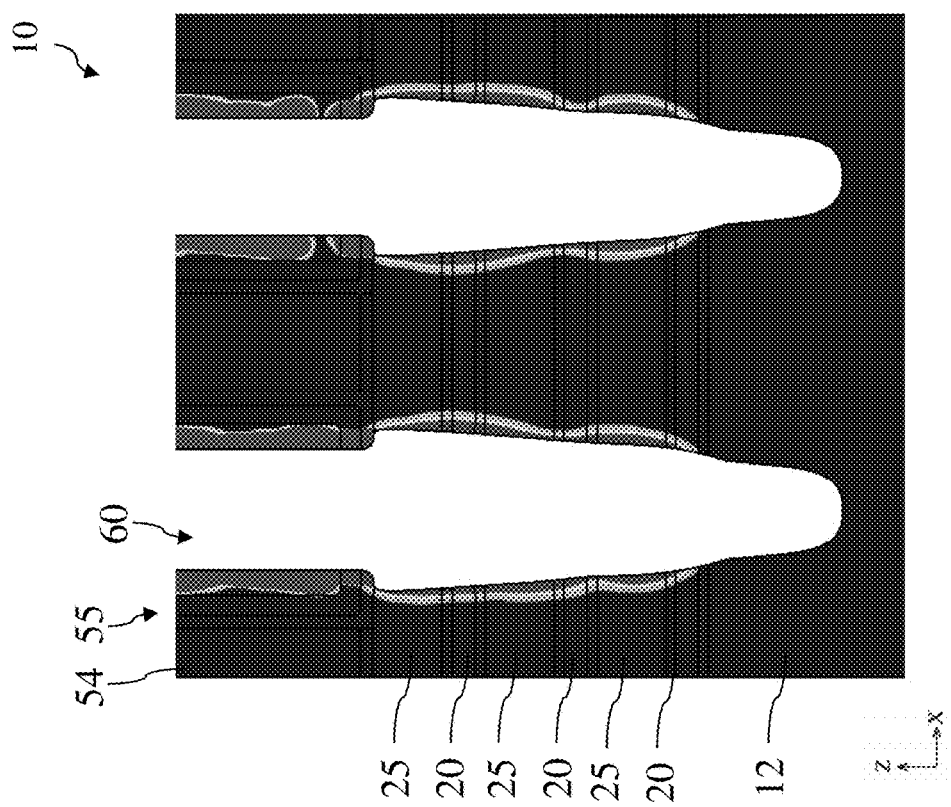

After the stacked structure of the semiconductor layers 20 and 25 has been etched through, referring to FIGS. 35 and 42, method 100″ proceeds to operation 122 where a selective etching process is performed to laterally recess the extruding end portions of the second semiconductor layers 25. Since each second semiconductor layer 25 has been individually implanted with the etch rate modifying species 66, the extent that end portions of each channel layer are recessed is individually determined by doping concentration and implantation depth to each channel layer. In some embodiments, after operation 122, the bottommost channel layer may provide the shortest channel among all and the topmost channel layer may provide the longest channel. In some alternative embodiments, after operation 122, the middle channel layer may provide the longest channel and the topmost and bottommost channel layer may have substantially equal length. Also compared with FIG. 14 discussed above, one difference is that in FIG. 14 a top surface portion of the substrate 12 is implanted with the etch rate modifying species 66 as well, while in FIG. 42 the top surface portion of the substrate 12 has less concentration than the shallow surface portions 68 or is substantially free of the etch rate modifying species 66.

Figure 43:
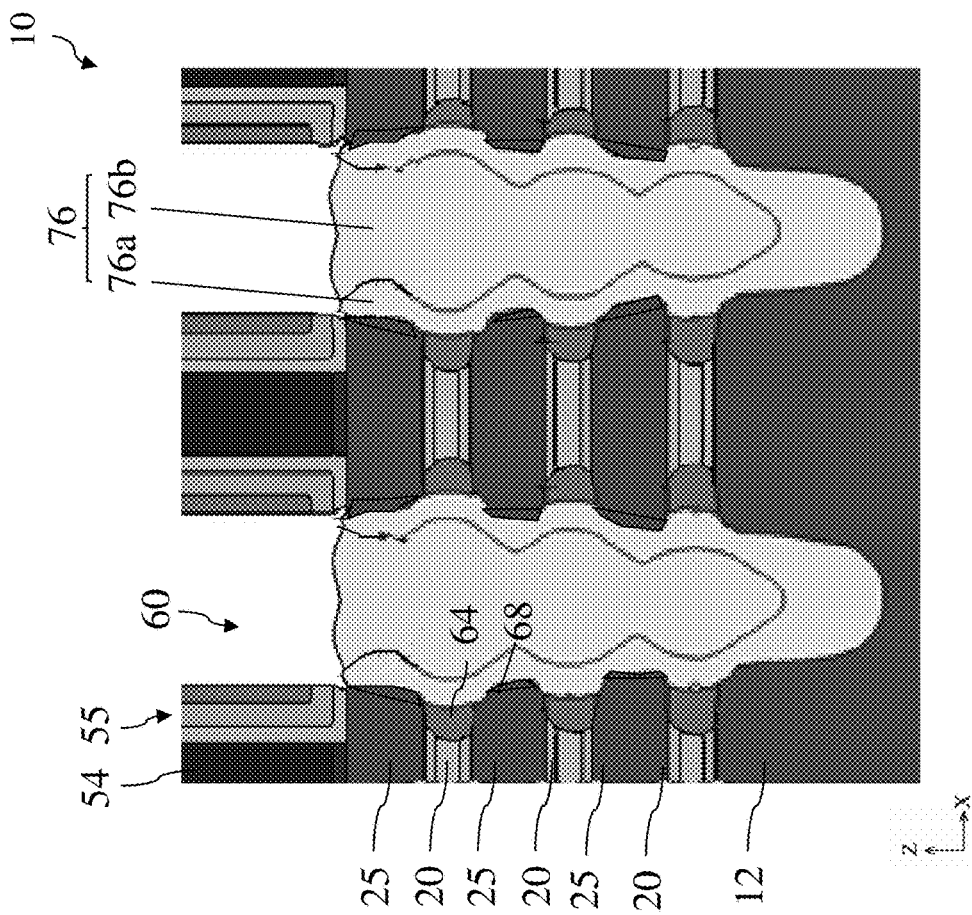

Referring to FIGS. 35 and 43, method 100″ proceeds to operations 116, 118, and 126 where end portions of the first semiconductor layers 20 are laterally etched and deposited with inner spacers 64 and an S/D epitaxial feature 76 is formed in the S/D trench 60. Operations 116, 118, and 126 of method 100″ are substantially similar to operations 116, 118, and 126 of method 100 discussed above.

Still referring to FIG. 43, depending on the selective etching depth in operation 122′, end portions of each second semiconductor layer 25 may individually have a shallow surface portion 68 doped with the etch rate modifying species 66 with the same or different doping concentrations. Generally, the highest doping concentration corresponds to the shortest channel length and the lowest doping concentration corresponds to the longest channel length. Further, the shallow surface portion 68 of each second semiconductor layer 25 may has the same or different thickness depending on respective implantation depth at operation 120″. Generally, the thickest shallow surface portion 68 corresponds to the shortest channel length and the thinnest shallow surface portion 68 corresponds to the longest channel length. The shallow surface portion 68 directly interfaces with the S/D epitaxial feature 76. The etch rate modifying species 66 in the shallow surface portion 68 may be the same type as the dopants in the S/D epitaxial feature 76, or an opposite type. The etch rate modifying species concentration in the shallow surface portion 68 may be higher than both layers 76a and 76b of the S/D epitaxial feature 76 or may be high than layer 76a but lower than layer 76b in some embodiments.

Although not intended to be limiting, one or more embodiments of the present disclosure provide many benefits to a semiconductor device and the formation thereof. For example, embodiments of the present disclosure provide an etch rate modulation and a selective etching process to fine tune extruding end portions (lateral ends) of channel layers, which increases uniformity of the device and reduces channel resistance. Furthermore, the process flow with etch rate modulation can be easily integrated into existing semiconductor fabrication processes.

In one exemplary aspect, the present disclosure is directed to a method of manufacturing a semiconductor device. The method includes forming a fin structure extruding from a substrate, the fin structure having first semiconductor layers and second semiconductor layers alternately stacked; forming a sacrificial gate structure over the fin structure; etching a source/drain (S/D) region of the semiconductor device, which is not covered by the sacrificial gate structure, thereby forming an opening exposing at least one second semiconductor layer; implanting an etch rate modifying species into the at least one second semiconductor layer though the opening, thereby forming an implanted portion of the at least one second semiconductor layer; selectively etching the implanted portion of the at least one second semiconductor layer; recessing end portions of the first semiconductor layers exposed in the opening; and forming an S/D epitaxial layer in the opening. In some embodiments, the etching of the S/D region forms the opening exposing a top surface of the substrate prior to the implanting of the etch rate modifying species. In some embodiments, the implanting of the etch rate modifying species implants the etch rate modifying species into end portions of each of the second semiconductor layers. In some embodiments, the first semiconductor layers are substantially free of the etch rate modifying species after the implanting of the etch rate modifying species. In some embodiments, after the etching of the S/D region, a neighboring first semiconductor layer underneath the at least one second semiconductor layer remains fully covered by the at least one second semiconductor layer. In some embodiments, the neighboring first semiconductor layer underneath the at least one second semiconductor layer also receives the etch rate modifying species during the implanting of the etch rate modifying species. In some embodiments, the selectively etching of the implanted portion of the at least one second semiconductor layer is prior to the recessing of the end portions of the first semiconductor layers. In some embodiments, the selectively etching of the implanted portion of the at least one second semiconductor layer is after the recessing of the end portions of the first semiconductor layers. In some embodiments, the etch rate modifying species is selected from the group consisting of As, B, and P. In some embodiments, the implanting of the etch rate modifying species includes a slanted implantation process. In some embodiments, the method further includes depositing inner spacers on the end portions of the first semiconductor layers; removing the first semiconductor layers from a channel region of the semiconductor device; and forming a metal gate structure replacing the sacrificial gate structure.

In another exemplary aspect, the present disclosure is directed to a method of manufacturing a semiconductor device. The method includes forming a fin extruding from a substrate, the fin having a plurality of sacrificial layers and a plurality of channel layers, wherein the sacrificial layers and the channel layers are alternately arranged; removing the sacrificial layers and the channel layers from a source/drain (S/D) region of the fin, thereby forming an S/D trench exposing end portions of the sacrificial layers and channel layers; laterally recessing the end portions of the sacrificial layers; implanting an etch rate modifying species into the end portions of the channel layers; trimming the end portions of the channel layers; and epitaxially growing an S/D feature in the S/D trench. In some embodiments, the method further includes forming inner spacers on the end portions of the sacrificial layers prior to the implanting of the etch rate modifying species. In some embodiments, the sacrificial layers are substantially free of the etch rate modifying species after the implanting of the etch rate modifying species. In some embodiments, a top surface of the substrate also receives the etch rate modifying species during the implanting of the etch rate modifying species. In some embodiments, the etch rate modifying species is selected from As, B, P, or a combination thereof.

In yet another exemplary aspect, the present disclosure is directed to a multi-gate semiconductor device. The multi-gate semiconductor device includes channel members disposed over a substrate; a gate structure engaging the channel members; and a source/drain (S/D) epitaxial feature adjacent the channel members, wherein at least one of the channel members has an end portion in physical contact with the S/D epitaxial feature, which includes a dopant of a first type, and wherein a concentration of the dopant in the end portion is higher than other portions of the at least one of the channel members. In some embodiments, the multi-gate semiconductor device further includes inner spacers interposing the gate structure and the S/D epitaxial feature, wherein the inner spacers are substantially free of the dopant. In some embodiments, the S/D epitaxial feature includes the dopant of the first type. In some embodiments, the S/D epitaxial feature includes another dopant of a second type that is opposite to the first type.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure extruding from a substrate, the fin structure having first semiconductor layers and second semiconductor layers alternately stacked;
    forming a sacrificial gate structure over the fin structure;
    etching a source/drain (S/D) region of the semiconductor device, which is not covered by the sacrificial gate structure, thereby forming an opening exposing at least one second semiconductor layer;
    implanting an etch rate modifying species into the at least one second semiconductor layer though the opening, thereby forming an implanted portion of the at least one second semiconductor layer;
    selectively etching the implanted portion of the at least one second semiconductor layer;
    recessing end portions of the first semiconductor layers exposed in the opening; and
    forming an S/D epitaxial layer in the opening.

2. The method of claim 1, wherein the etching of the S/D region forms the opening exposing a top surface of the substrate prior to the implanting of the etch rate modifying species.

3. The method of claim 2, wherein the implanting of the etch rate modifying species implants the etch rate modifying species into end portions of each of the second semiconductor layers.

4. The method of claim 2, wherein the first semiconductor layers are substantially free of the etch rate modifying species after the implanting of the etch rate modifying species.

5. The method of claim 1, wherein after the etching of the S/D region, a neighboring first semiconductor layer underneath the at least one second semiconductor layer remains fully covered by the at least one second semiconductor layer.

6. The method of claim 5, wherein the neighboring first semiconductor layer underneath the at least one second semiconductor layer also receives the etch rate modifying species during the implanting of the etch rate modifying species.

7. The method of claim 1, wherein the selectively etching of the implanted portion of the at least one second semiconductor layer is prior to the recessing of the end portions of the first semiconductor layers.

8. The method of claim 1, wherein the selectively etching of the implanted portion of the at least one second semiconductor layer is after the recessing of the end portions of the first semiconductor layers.

9. The method of claim 1, wherein the etch rate modifying species is selected from the group consisting of As, B, and P.

10. The method of claim 1, wherein the implanting of the etch rate modifying species includes a slanted implantation process.

11. The method of claim 1, further comprising:
depositing inner spacers on the end portions of the first semiconductor layers;
removing the first semiconductor layers from a channel region of the semiconductor device; and
forming a metal gate structure replacing the sacrificial gate structure.

12. A method of manufacturing a semiconductor device, comprising:
forming a fin extruding from a substrate, the fin having a plurality of sacrificial layers and a plurality of channel layers, wherein the sacrificial layers and the channel layers are alternately arranged;
removing the sacrificial layers and the channel layers from a source/drain (S/D) region of the fin, thereby forming an S/D trench exposing end portions of the sacrificial layers and channel layers;
laterally recessing the end portions of the sacrificial layers;
implanting an etch rate modifying species into the end portions of the channel layers;
trimming the end portions of the channel layers; and
epitaxially growing an S/D feature in the S/D trench.

13. The method of claim 12, further comprising:
forming inner spacers on the end portions of the sacrificial layers prior to the implanting of the etch rate modifying species.

14. The method of claim 12, wherein the sacrificial layers are substantially free of the etch rate modifying species after the implanting of the etch rate modifying species.

15. The method of claim 12, wherein a top surface of the substrate also receives the etch rate modifying species during the implanting of the etch rate modifying species.

16. The method of claim 12, wherein the etch rate modifying species is selected from As, B, P, or a combination thereof.

* * * * *